(12) United States Patent
Kobayashi et al.

(10) Patent No.: US 11,972,229 B2
(45) Date of Patent: Apr. 30, 2024

(54) SEMICONDUCTOR DEVICE AND MULTIPLY-ACCUMULATE OPERATION DEVICE

(71) Applicants: Sony Corporation, Tokyo (JP); Sony Semiconductor Solutions Corporation, Kanagawa (JP)

(72) Inventors: Toshiyuki Kobayashi, Kanagawa (JP); Rui Morimoto, Kanagawa (JP); Jun Okuno, Kanagawa (JP); Masanori Tsukamoto, Kanagawa (JP); Yusuke Shuto, Kanagawa (JP)

(73) Assignees: Sony Group Corporation, Tokyo (JP); Sony Semiconductor Solutions Corporation, Kanagawa (JP)

( * ) Notice: Subject to any disclaimer, the term of this patent is extended or adjusted under 35 U.S.C. 154(b) by 885 days.

(21) Appl. No.: 17/040,959

(22) PCT Filed: Mar. 15, 2019

(86) PCT No.: PCT/JP2019/011016
§ 371 (c)(1),
(2) Date: Sep. 23, 2020

(87) PCT Pub. No.: WO2019/188457
PCT Pub. Date: Oct. 3, 2019

(65) Prior Publication Data
US 2021/0026601 A1    Jan. 28, 2021

(30) Foreign Application Priority Data
Mar. 30, 2018  (JP) ................................ 2018-069791

(51) Int. Cl.
*G06F 7/544*    (2006.01)
*G06G 7/16*    (2006.01)
(Continued)

(52) U.S. Cl.
CPC ............. *G06F 7/5443* (2013.01); *G06G 7/16* (2013.01); *G11C 11/223* (2013.01); *H01L 29/78391* (2014.09); *H10B 51/30* (2023.02)

(58) Field of Classification Search
CPC ......... G06F 7/5443; G06F 17/16; G06G 7/16; G06N 3/063–065; H01L 27/78391
See application file for complete search history.

(56) References Cited

U.S. PATENT DOCUMENTS 5,596,309 A * 1/1997 Nabeshima ............... H01C 3/02
                                                   338/214
11,461,620 B2 * 10/2022 Obradovic ............. G06N 3/063
(Continued)

FOREIGN PATENT DOCUMENTS

| CN | 107273973 A | 10/2017 |
|---|---|---|
| CN | 107408222 A | 11/2017 |

(Continued)

OTHER PUBLICATIONS

WO_2014068961_A1_I_MT is a machine translation of WO_2014068961_A1_I (Year: 2014).*

*Primary Examiner* — Andrew Caldwell
*Assistant Examiner* — Carlo Waje
(74) *Attorney, Agent, or Firm* — Michael Best & Friedrich LLP

(57) ABSTRACT

Semiconductor devices and multiply-accumulate operation devices are disclosed. In one example, a semiconductor device includes synapses in which a nonvolatile variable resistance element taking a first resistance value and a second resistance value lower than the first resistance value and a fixed resistance element having a resistance value higher than the second resistance value are connected in series. An output line outputs a sum of currents flowing through the plurality of synapses.

19 Claims, 20 Drawing Sheets

(51) Int. Cl.
    *G11C 11/22*     (2006.01)
    *H01L 29/78*     (2006.01)
    *H10B 51/30*     (2023.01)

(56) References Cited

U.S. PATENT DOCUMENTS

| | | | |
|---|---|---|---|
| 2012/0074507 A1* | 3/2012 | Jo | H10N 70/8416 |
| | | | 257/E21.616 |
| 2016/0125287 A1 | 5/2016 | Pantazi | |
| 2016/0379110 A1 | 12/2016 | Eleftheriou et al. | |
| 2018/0225566 A1* | 8/2018 | Lee | G06N 3/049 |
| 2019/0108433 A1* | 4/2019 | Hsu | G06N 3/04 |
| 2020/0251526 A1* | 8/2020 | Lesso | H10N 50/10 |

FOREIGN PATENT DOCUMENTS

| | | | | |
|---|---|---|---|---|
| CN | 107615307 A | 1/2018 | | |
| JP | 2009-282782 A | 12/2009 | | |
| JP | 2015-195011 A | 11/2015 | | |
| JP | 2017-130195 A | 7/2017 | | |
| TW | 201637015 A | 10/2016 | | |
| TW | 201741942 A | 12/2017 | | |
| WO | WO-2014068961 A1 * | 5/2014 | | G11C 11/14 |

\* cited by examiner

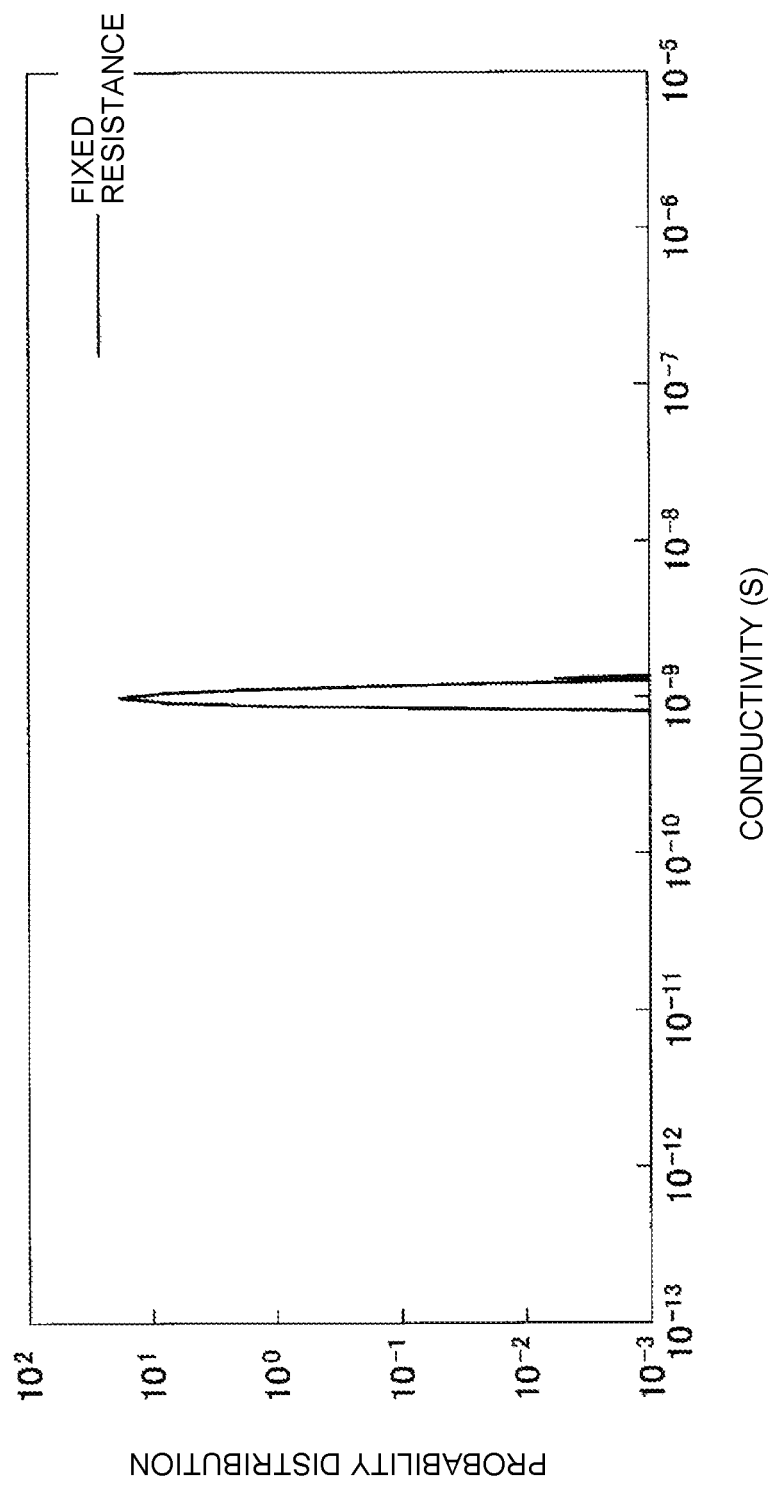

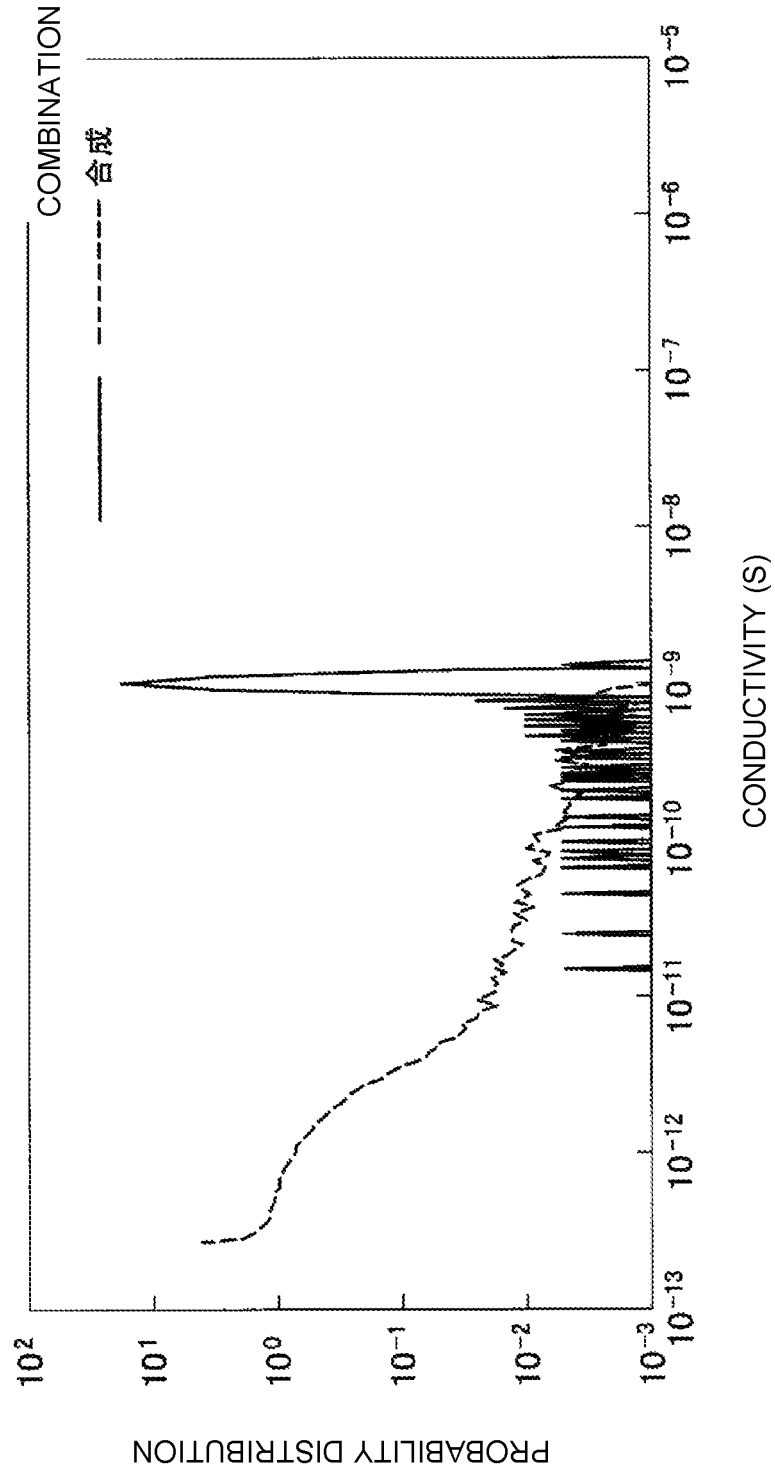

SEMICONDUCTOR DEVICE AND MULTIPLY-ACCUMULATE OPERATION DEVICE

FIELD

The present disclosure relates to a semiconductor device and a multiply-accumulate operation device.

BACKGROUND

In recent years, a neural network (also referred to as an artificial neural network), which is one of machine learning, has attracted attention. The neural network can be implemented as an analog circuit that applies Ohm's law and Kirchhoff's current law by associating a resistor with a synapse that is a connection between neurons.

Therefore, various studies have been conducted regarding the configuration of the analog circuit that realizes the neural network. For example, Patent Literature 1 below discloses a neural network device in which two field-effect transistors and one capacitor are used to form one synapse. In the neural network device disclosed in Patent Literature 1, the amount of charge accumulated in a gate of a first field-effect transistor, which is a synapse resistance, is controlled by a second field-effect transistor to control a channel resistance of the first field-effect transistor.

CITATION LIST

Patent Literature

Patent Literature 1: JP 2017-130195 A

SUMMARY

Technical Problem

However, in the neural network device disclosed in Patent Literature 1 described above, it is necessary to increase a load capacity of the gate of the first field-effect transistor in order to maintain the channel resistance of the first field-effect transistor for a long time. Further, it is necessary to increase the area occupied by the second field-effect transistor in order to suppress a leak current. Therefore, the neural network device disclosed in Patent Literature 1 requires a large mounting area per synapse, which makes integration difficult.

In view of this, the present disclosure proposes novel and improved semiconductor device and multiply-accumulate operation device that enables integration at a higher density by further reducing a mounting area per synapse.

Solution to Problem

According to the present disclosure, a semiconductor device is provided that includes: a plurality of synapses in which a nonvolatile variable resistance element taking a first resistance value and a second resistance value lower than the first resistance value and a fixed resistance element having a resistance value higher than the second resistance value are connected in series; and an output line that outputs a sum of currents flowing through the plurality of synapses.

Moreover, according to the present disclosure, a multiply-accumulate operation device is provided that includes: a plurality of synapses in which a nonvolatile variable resistance element taking two values of a first resistance value and a second resistance value lower than the first resistance value and a fixed resistance element having a resistance value higher than the second resistance value are connected in series; and an output line that outputs a sum of currents flowing through the plurality of synapses.

According to the present disclosure, a synapse is configured using a nonvolatile variable resistance element capable of holding a resistance value for a long time without supplying power, and thus, it is possible to reduce the area per synapse in the multiply-accumulate operation device.

Advantageous Effects of Invention

According to the present disclosure, it is possible to realize the integration at a higher density by further reducing the mounting area per synapse in the semiconductor device and the multiply-accumulate operation device as described above.

Note that the foregoing advantageous effects are not necessarily limited, rather, any advantageous effects disclosed in the present specification or other advantageous effects which can be ascertained from the present specification may be included in addition to the foregoing advantageous effects or instead of the foregoing advantageous effects.

BRIEF DESCRIPTION OF DRAWINGS

FIG. 5B is a graph illustrating an example of a conductivity distribution of a resistance of a fixed resistance element.

FIG. 5C is a graph illustrating an example of a conductivity distribution of a combined resistance of a serial connection of the ferroelectric transistor and the fixed resistance element.

DESCRIPTION OF EMBODIMENTS

Preferred embodiments of the present disclosure will be described in detail hereinbelow with reference to the accompanying drawings. Note that repetitive descriptions are omitted from the present specification and drawings by assigning the same reference signs to constituent elements which have substantially the same function configurations.

Note that the description will be given in the following order.

1. Technical Background of Present Disclosure
2. Configuration of Multiply-Accumulate Operation Device
3. Accuracy of Multiply-Accumulate Operation Device
4. Accuracy of Image Classification
5. Specific Structure of Multiply-Accumulate Operation Device <1. Technical Background of Present Disclosure>

First, the technical background of the present disclosure will be described with reference to FIGS. 1 and 2.

A neural network is an information processing system that models a neural network of a living body. The neural network can efficiently execute an operation that causes a high load on a digital computer, such as image recognition and image compression or decompression. As one of such neural networks, for example, a perceptron in which artificial neurons arrayed in layers are coupled only between adjacent layers and information propagates only in one direction from an input side to an output side can be exemplified.

Figure 1:
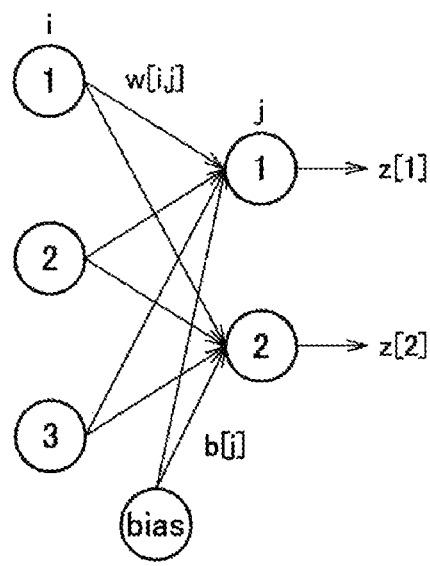
FIG. 1 is a schematic diagram of a single-layer perceptron, which is one of neural networks.

FIG. 1 illustrates a schematic diagram of a single-layer perceptron. In FIG. 1, each circle represents a neuron, and an arrow between neurons represents a synapse.

As illustrated in FIG. 1, an input signal from a neuron [i] to a synapse is x[i], a synaptic weight connecting the neuron [i] and a neuron [j] is w[i,j], and an output from the neuron [j] is z[j]. At this time, the input u[j] to the neuron [j] is a value obtained by adding a threshold b[j] (bias) to the sum of products of x[i] and w[i,j] (that is, u[j]=Σ(x[i]×w[i,j]+b[j])). Further, z[j] is determined by an output of an activation function f having u[j] as an input (that is, z[j]=f(u[j]), and an output value z[n] is a value for a neuron of the next hierarchical layer.

A multiply-accumulate operation Σ(x[i]×w[i,j]) in such a neural network can be executed faster and more efficiently by an analog multiply-accumulate operation device than by a digital computer.

Figure 2:
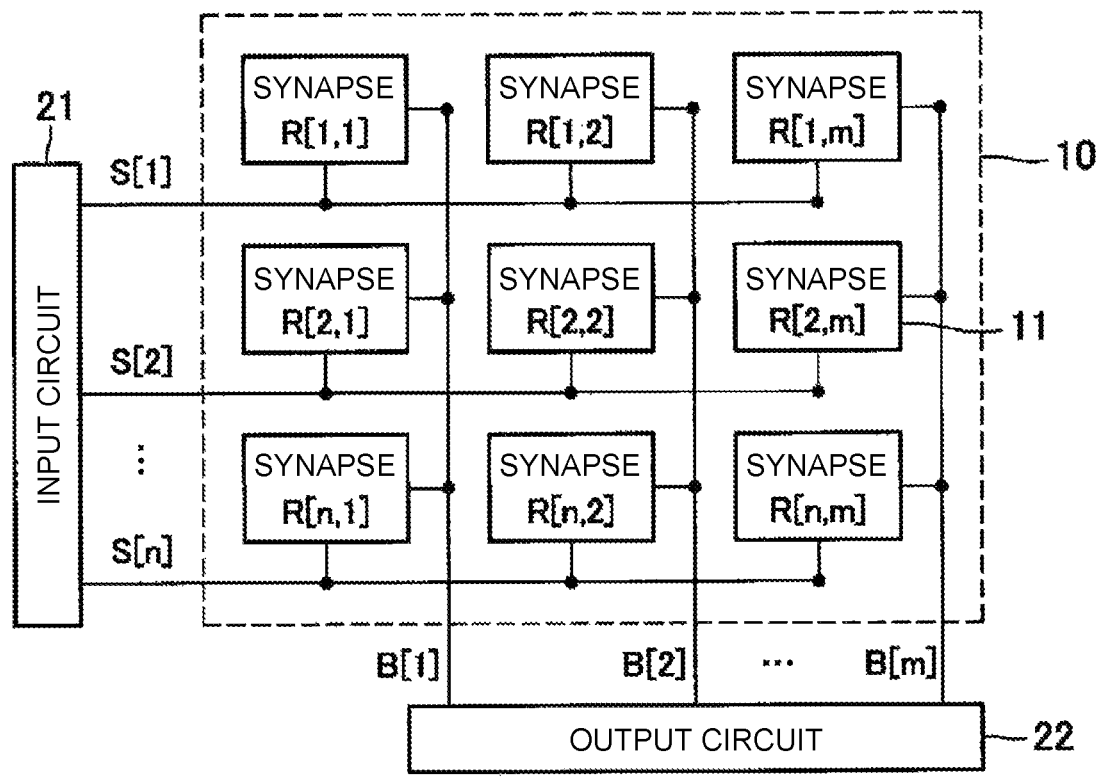
FIG. 2 is a block diagram illustrating an example of a configuration of a multiply-accumulate operation device.

Here, an example of a configuration of the multiply-accumulate operation device is illustrated in FIG. 2.

As illustrated in FIG. 2, for example, the multiply-accumulate operation device includes: a multiply-accumulate operation circuit 10 configured by connecting a plurality of wirings and a plurality of synapses 11 in a matrix of n rows and m columns; an input circuit 21; and an output circuit 22. Note that n is an integer larger than one, and m is an integer larger than zero.

A voltage $V_S[i]$ is applied to a synapse 11[i,j] from the input circuit 21 through an input wiring S[i]. As a result, a current $I[j](=V_S[i]×G[i,j])$ flows through the synapse 11[i,j]

depending on a conductivity G[i,j] (=1/R[i,j]) of the synapse 11. An output of each of the synapses 11 is connected to a common output wiring B[j], and the output circuit 22 can acquire a multiply-accumulate operation result $\Sigma(V_S[i] \times G[i,j])$ by measuring the current flowing through the wiring B[j]. The output circuit 22 measures each of the currents flowing through the output wiring B[j] simultaneously and in parallel. Note that the output circuit 22 may further have a function, such as current-voltage conversion, analog-digital conversion, amplification, and calculation of the sum of or a difference between adjacent output wirings, if necessary.

Note that the multiply-accumulate operation result may be calculated in the output circuit 22 by measuring a potential of the wiring B[j], instead of measuring the current flowing through the wiring B[j], and multiplying the measured potential by a predetermined coefficient. Further, the bias b[j] can be implemented, for example, by providing a plurality of output lines for each single multiply-accumulate operation and synapses respectively connected to the plurality of output lines and calculating a difference in current between the plurality of output lines using the output circuit 22 or by calculating a difference between a plurality of current sources or voltage sources using different systems of current sources or voltage sources.

Here, when the synapse 11 is constituted by a plurality of field-effect transistors, it is conceivable to change a channel resistance of a first field-effect transistor by controlling the amount of charge accumulated in a gate of the first field-effect transistor by a second field-effect transistor. In such a method, however, it is necessary to increase a load capacity of the gate in order to maintain a resistance value of the channel resistance of the first field-effect transistor for a long time. Further, it is also necessary to increase a size of the second field-effect transistor in order to suppress a leak current. Therefore, the area per synapse 11 becomes large in the multiply-accumulate operation device provided with the multiply-accumulate operation circuit 10 in which the synapse 11 is constituted by the plurality of field-effect transistors, which makes it difficult to realize high-density integration.

In the multiply-accumulate operation device according to an embodiment of the present disclosure, a nonvolatile variable resistance element is used to form the synapse. The nonvolatile variable resistance element can hold a resistance value for a long time without supplying power and operate even in small dimensions, and thus, it is possible to reduce the area per synapse of the multiply-accumulate operation device and to realize the integration at a higher density.

<2. Configuration of Multiply-Accumulate Operation Device>

Figure 3:
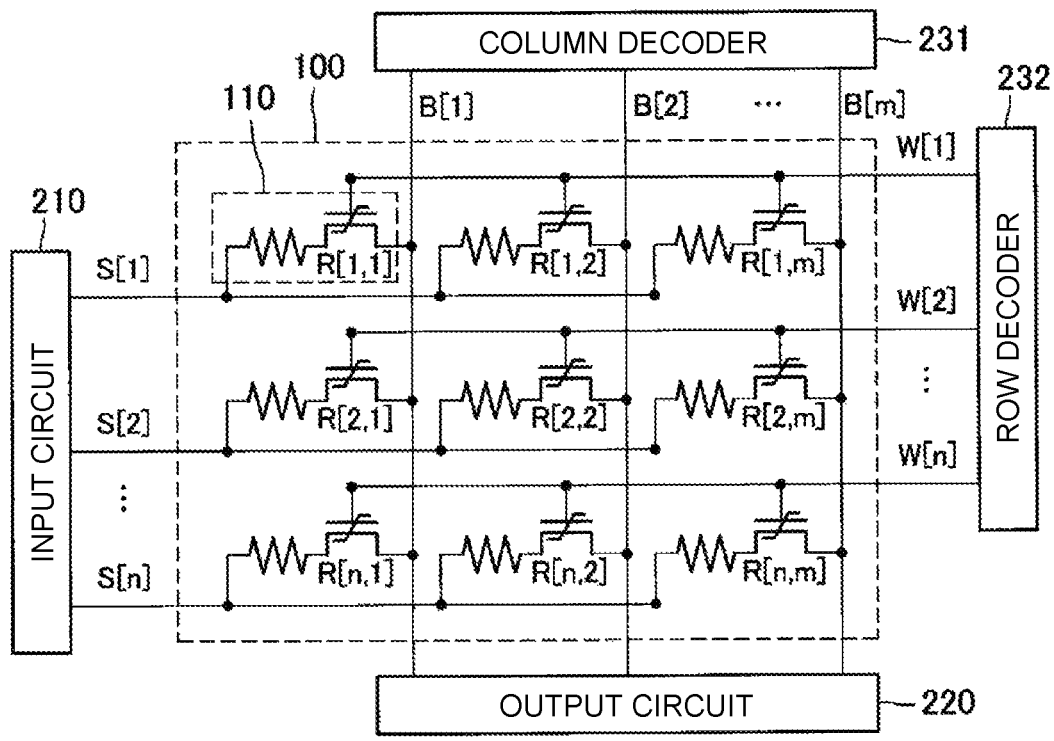
FIG. 3 is a schematic circuit diagram illustrating an example of a configuration of a multiply-accumulate operation device according to an embodiment of the present disclosure.

Next, a configuration of the multiply-accumulate operation device according to the present embodiment will be described with reference to FIG. 3. FIG. 3 is a schematic circuit diagram illustrating an example of the configuration of the multiply-accumulate operation device according to the present embodiment.

As illustrated in FIG. 3, the multiply-accumulate operation device includes: a multiply-accumulate operation circuit 100 including a plurality of synapses 110 in which nonvolatile variable resistance elements and fixed resistance elements are connected in series; an input circuit 210 that outputs an input signal to the plurality of synapses; an output circuit 220 that calculates an input signal to a circuit in a subsequent stage based on the sum of currents flowing through the plurality of synapses 110; and a column decoder 231 and a row decoder 232 that control resistance values of nonvolatile variable resistance elements included in the plurality of synapses 110. The multiply-accumulate operation circuit 100 may be configured by arranging the plurality of synapses 110 in a matrix of n rows and m columns, for example.

The nonvolatile variable resistance element is a nonvolatile variable resistance element using a transistor, and is, for example, a ferroelectric transistor (Ferroelectric-gate Field-Effect Transistor: FeFET), a floating gate transistor, a metal-oxide-nitride-oxide-silicon (MONOS) transistor, a spin transistor, or the like.

Here, details of the multiply-accumulate operation device according to the present embodiment will be described mainly with a case where the nonvolatile variable resistance element is the ferroelectric transistor (FeFET). However, it goes without saying that the other transistors described above can be used instead of the ferroelectric transistor.

The ferroelectric transistor is a field-effect transistor using a ferroelectric material for a gate insulating film. The ferroelectric transistor can change a threshold voltage Vt of a gate by applying a gate voltage Vg to invert the polarization of the gate insulating film formed using the ferroelectric material. Further, the ferroelectric transistor can hold a polarization state of the ferroelectric material for a long time without requiring a power source or the like.

In the ferroelectric transistor, Vt of the ferroelectric transistor shifts in a negative direction when a positive gate voltage is applied, and Vt of the ferroelectric transistor shifts in a positive direction when a negative gate voltage is applied. Further, the value of Vt can be determined depending on a type of the ferroelectric material, a magnitude of the applied gate voltage, an application time, and the like. Therefore, the ferroelectric transistor can take different binary channel resistances when compared at a constant gate voltage (for example, Vg=0 V).

Note that the ferroelectric material is polarized in a domain structure, and thus, a resistance value of the ferroelectric transistor can be adjusted to a plurality of values in principle, but it is not easy to stably adjust the ferroelectric material to an intermediate polarization state. Therefore, in the multiply-accumulate operation device, a sufficiently strong electric field is applied to the gate insulating film of the ferroelectric transistor for a long time to saturate the polarization upward or downward, thereby using the ferroelectric transistor as the variable resistance element that can take two resistance values. Note that the two polarization states described above correspond to a low resistance state (which corresponds to an on-state, and a resistance value at this time is referred to as an on-resistance) and a high resistance state (which corresponds to an off-state, and a resistance value at this time is referred to as an off-resistance) of the ferroelectric transistor.

Figure 4:
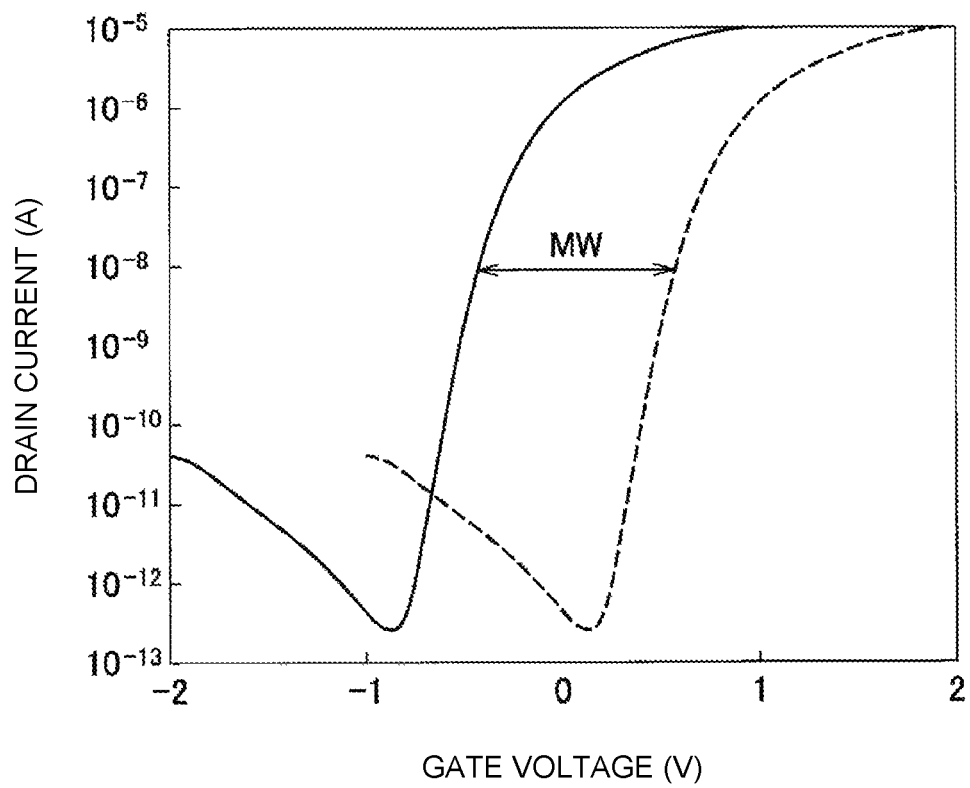
FIG. 4 is a graph illustrating an example of Id-Vg characteristics of a ferroelectric transistor.

FIG. 4 illustrates a graph illustrating an example of drain current-gate voltage characteristics (Id-Vg characteristics) in the two polarization states of the ferroelectric transistor.

As illustrated in FIG. 4, Vt greatly differs depending on the polarization state in the ferroelectric transistor. Note that the difference in Vt between the two polarization states is also referred to as a memory window MW. Here, a polarization state of a gate insulating film made of a ferroelectric material differs for each ferroelectric transistor, and MW and Vt exhibit constant distributions. For example, an average value of MW of a ferroelectric transistor using hafnium oxide ($HfO_2$) as the gate insulating film is 0.36 V to 0.77 V with a device size of 34 nm to 500 nm, and a standard deviation is 0.28 V to 0.17 V. That is, in the ferroelectric transistor, each of resistance values of the two polarization states exhibits a wide distribution (that is, the variation is large).

When the ferroelectric transistor with the large resistance value distribution is used for the synapse 110, an error between a set value and an actual value of a synapse resistance becomes large, and thus, accuracy of a multiply-accumulate operation is likely to significantly decrease.

Therefore, in the multiply-accumulate operation device, the fixed resistance element may be further connected in series to the ferroelectric transistor, which is the nonvolatile variable resistance element, to constitute the synapse 110 as illustrated in FIG. 3. Accordingly, the multiply-accumulate operation device can suppress the resistance value distribution in the entire synapse 110. Note that one fixed resistance element may be provided, or a plurality of fixed resistance elements may be provided in series.

Specifically, one having a resistance value higher than the on-resistance of the ferroelectric transistor is used as the fixed resistance element. Since the resistance value is fixed, the fixed resistance element can make the resistance value distribution smaller than that of the ferroelectric transistor having a variable resistance value. Therefore, a spread of a distribution of a combined resistance in the entire synapse 110 can be reduced by connecting the fixed resistance element in series to the ferroelectric transistor.

Figure 5A:
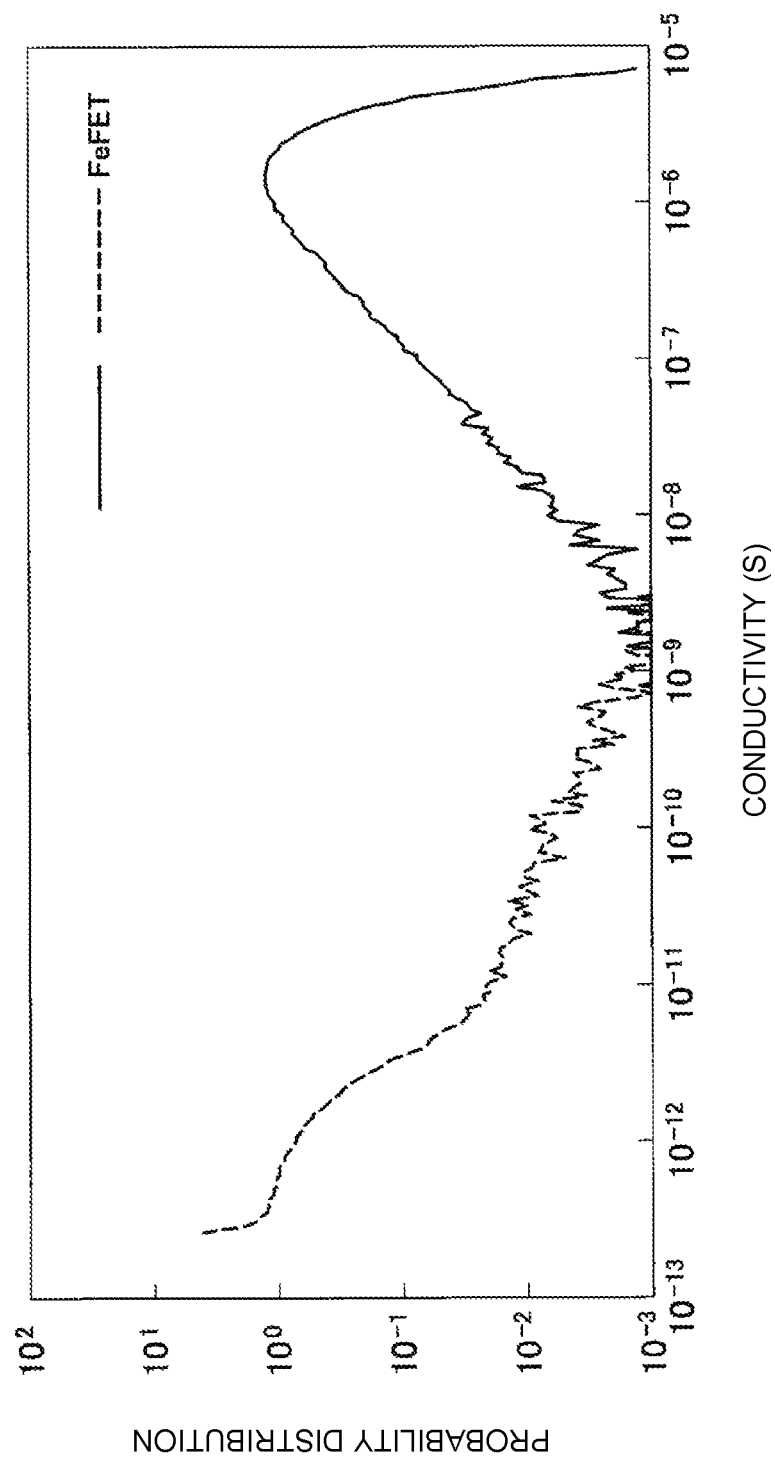
FIG. 5A is a graph illustrating an example of a conductivity distribution of a resistance of the ferroelectric transistor.

FIGS. 5A to 5C respectively illustrate examples of conductivity distributions of the resistance of the ferroelectric transistor, the resistance of the fixed resistance element, the combined resistance in the series connection of the ferroelectric transistor and the fixed resistance element. Note that FIG. 5A illustrates the conductivity distribution of the ferroelectric transistor which has average characteristics illustrated in FIG. 4 and in which a standard deviation $\sigma_{vt}$ of Vt is 0.15 V. Further, FIG. 5B illustrates the conductivity distribution of the fixed resistance element in which an average resistance value $\mu_R$ is 1 GΩ and a standard deviation $\sigma_R$ is $0.05\mu_R$. FIG. 5C illustrates the conductivity distribution of the combined resistance of the ferroelectric transistor and the fixed resistance element described above.

Referring to FIGS. 5A to 5C, it can be understood that the conductivity distribution in the off-state is almost equal to the conductivity distribution of the ferroelectric transistor alone when the fixed resistance element with 1 GΩ is connected in series to the ferroelectric transistor. On the other hand, it can be understood that the conductivity distribution in the on-state is almost equal to the conductivity distribution of the fixed resistance element alone. At this time, if the conductivity distribution of the combined resistance of the ferroelectric transistor and the fixed resistance element is approximated by a standard normal distribution, it can be understood that the standard deviation of the on-state normalized by the average value is about 1/10 of the conductivity distribution of the ferroelectric transistor alone, which is a significant improvement. Therefore, the multiply-accumulate operation device according to the present embodiment can reduce the spread of the resistance value distribution in the on-state in the entire synapse 110 by connecting the fixed resistance element in series to the ferroelectric transistor to constitute the synapse 110.

Figure 6A:
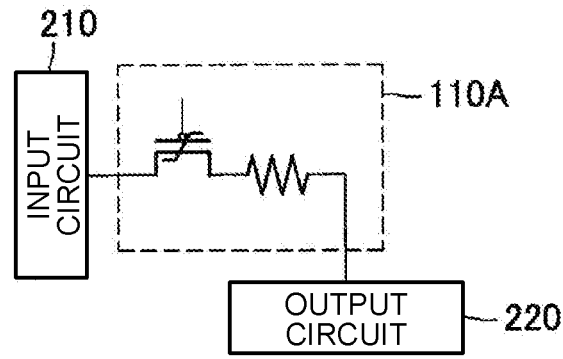
FIG. 6A is a circuit diagram in which one synapse is extracted in order to illustrate a connection between the fixed resistance element and the ferroelectric transistor.
Figure 6B:
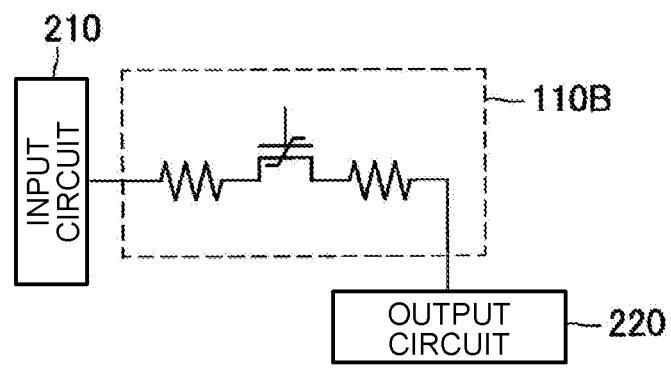
FIG. 6B is a circuit diagram in which one synapse is extracted in order to illustrate the connection between the fixed resistance element and the ferroelectric transistor.

Here, the fixed resistance element may be connected to either an input side of the ferroelectric transistor (that is, the side on which the input circuit 210 is provided) or an output side (that is, the side on which the output circuit 220 is provided). For example, as illustrated in FIG. 3, the fixed resistance element may be connected to the input side of the ferroelectric transistor. Alternatively, the fixed resistance element may be connected to the output side of the ferroelectric transistor in a synapse 110A as illustrated in FIG. 6A. Further, the fixed resistance element may be connected to both the input side and the output side of the ferroelectric transistor in a synapse 110B as illustrated in FIG. 6B.

However, when the ferroelectric transistor is n-type, the fixed resistance element may be connected to the input side of the ferroelectric transistor. On the other hand, when the ferroelectric transistor is p-type, the fixed resistance element may be connected to the output side of the ferroelectric transistor. According to this configuration, the multiply-accumulate operation device can reduce a substrate bias effect on the ferroelectric transistor, which is caused by providing the fixed resistance element, and thus, it is possible to suppress a variation in threshold voltage of the ferroelectric transistor. Note that the manufacturing efficiency of the multiply-accumulate operation device can be improved in some cases when the fixed resistance element is provided on both the input side and the output side of the ferroelectric transistor.

In the multiply-accumulate operation device illustrated in FIG. 3, for example, an input signal (input vector) x[i] can be input as a voltage from the input circuit 210, and the total sum of currents flowing through the respective synapses 110 can be detected by the output circuit 220. Alternatively, in the multiply-accumulate operation device, the input signal (input vector) x[i] can be input also by applying a constant voltage from the input circuit 210 to the respective synapses 110 and controlling on/off of the ferroelectric transistor using the row decoder 232.

For example, when the input signal x[i] is 0 V or 1 V, an input signal [i] may be directly input from the input circuit 210 to the multiply-accumulate operation circuit 100. Alternatively, the input signal [i] can be also input to the multiply-accumulate operation circuit 100 by setting the ferroelectric transistor such that the off-state is necessarily set when the gate voltage is 0 V, and then, constantly applying 1 V from the input circuit 210 and applying a positive voltage to the gate of the ferroelectric transistor at the time of performing the operation to set the ferroelectric transistor to the on-state.

Note that a gate wiring W[n] may be drawn from the multiply-accumulate operation circuit 100 in a direction parallel to an output wiring B[m], instead of an input wiring S[n].

Further, writing of the weight (that is, resistance value) of each of the synapses 110 can be also performed by applying a voltage to the gate of the ferroelectric transistor using the row decoder 232 and the column decoder 231, for example.

Figure 7A:
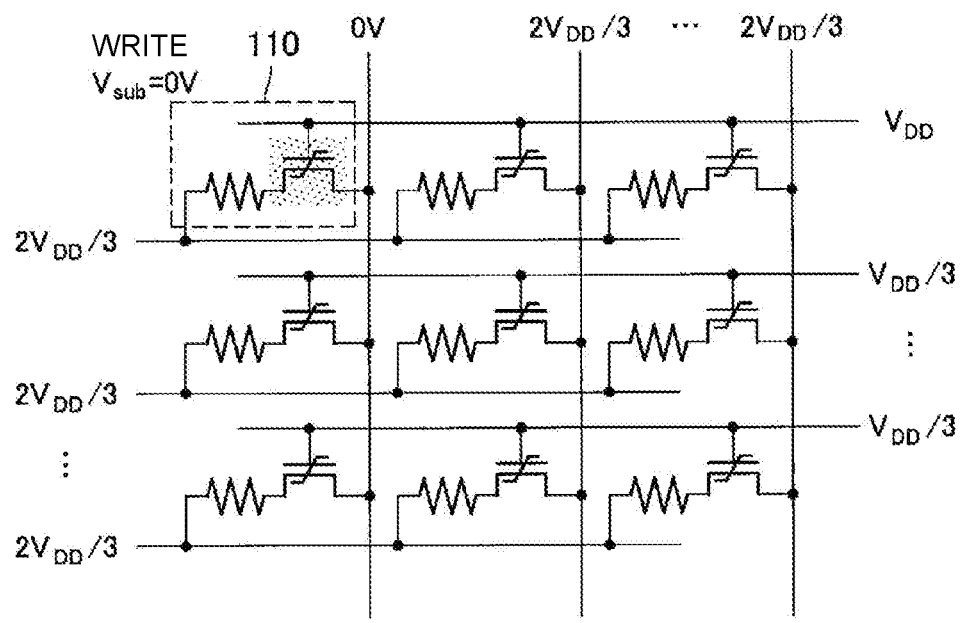
FIG. 7A is an explanatory diagram illustrating an example of a write voltage for each synapse.
Figure 7B:
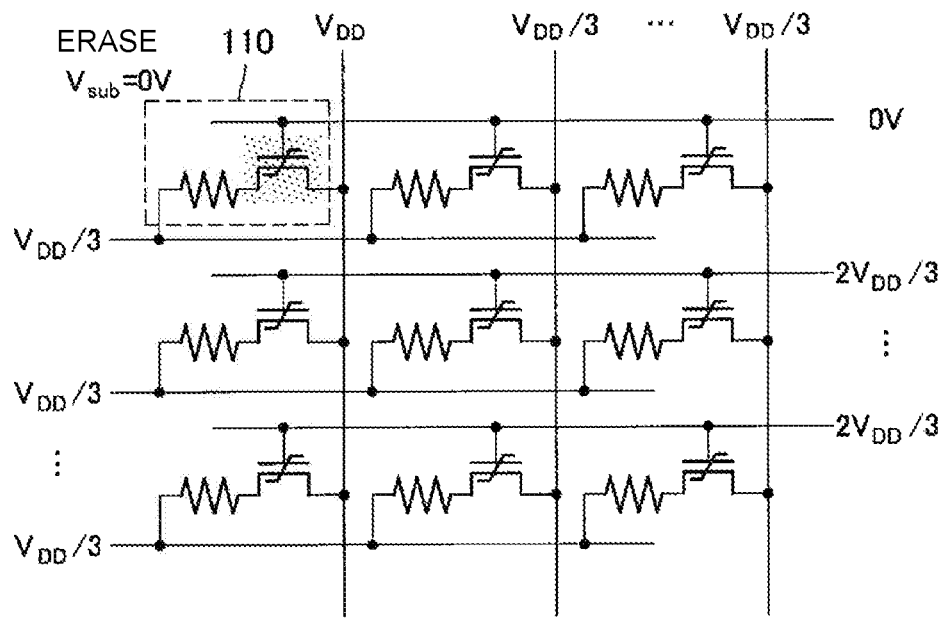
FIG. 7B is an explanatory diagram illustrating an example of an erase voltage for each synapse.
Figure 7C:
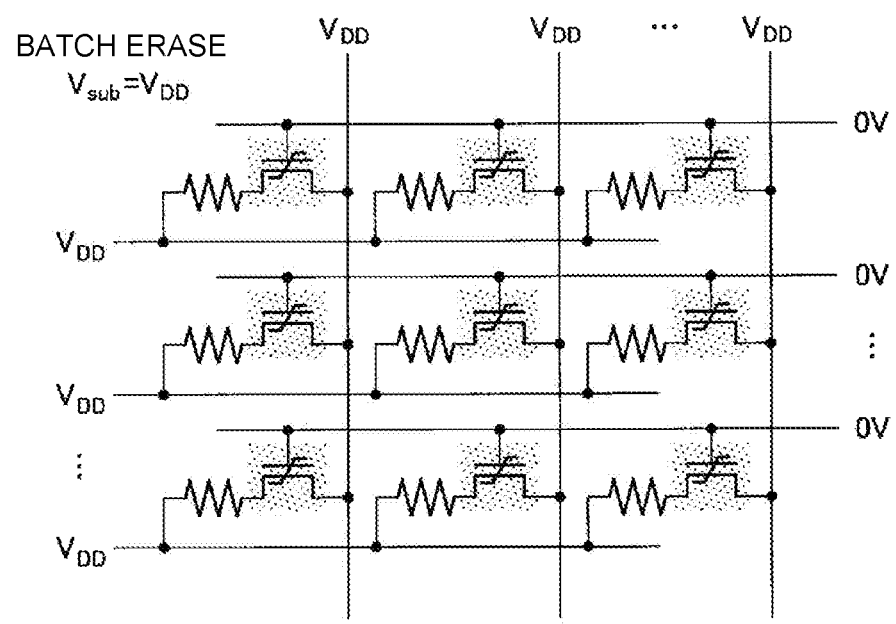
FIG. 7C is an explanatory diagram illustrating an example of a batch erase voltage for the entire synapse.

A specific example of writing (that is, setting low resistance) or erasing (that is, setting high resistance) for each of the synapses 110 will be described with reference to FIGS. 7A to 7C. FIG. 7A is an explanatory diagram illustrating an example of a write voltage for each of the synapses 110, FIG. 7B is an explanatory diagram illustrating an example of an erase voltage for each of the synapses 110, and FIG. 7C is an explanatory diagram illustrating an example of a batch erase voltage for the entire synapse 110. Note that only the part of the multiply-accumulate operation circuit 100 is extracted in FIGS. 7A to 7C, and the input circuit 210 and the output circuit 220 are not described.

As illustrated in FIG. 7A, when writing the weight in the synapse 110, the row decoder 232 applies $V_{DD}$ to a wiring connected to a gate of a ferroelectric transistor of the selected synapse 110, and applies $V_{DD}/3$ to the other wirings. Further, the column decoder 231 applies 0 V to a wiring connected to a source or a drain of the ferroelectric transistor of the selected synapse 110, and applies $2V_{DD}/3$ to the other wirings. Furthermore, the input circuit 210 applies $2V_{DD}/3$ to all input lines.

Accordingly, a potential difference of $V_{DD}$ with the gate side being positive is applied to a gate insulating film of the ferroelectric transistor of the selected synapse 110. On the other hand, a potential difference of $V_{DD}/3$ ($=V_{DD}/3-0$ V) is applied to a gate insulating film of a ferroelectric transistor of a synapse in the same column as the synapse 110, a potential difference of $V_{DD}/3$ ($=V_{DD}-2V_{DD}/3$) is applied to a gate insulating film of a ferroelectric transistor of a synapse in the same row as the synapse 110, and a potential difference of $V_{DD}/3$ ($=2V_{DD}/3-V_{DD}/3$) is applied to gate insulating films of ferroelectric transistors of other synapses. Therefore, the multiply-accumulate operation device can perform writing only to the selected synapse 110 by appropriately setting the potential of $V_{DD}$ such that a potential difference that inverts the polarization of the gate insulating film of the ferroelectric transistor becomes a value between $V_{DD}$ and $V_{DD}/3$.

On the other hand, as illustrated in FIG. 7B, when deleting the weight that has been written in the synapse 110, the row decoder 232 applies 0 V to a wiring connected to a gate of a ferroelectric transistor of the selected synapse 110, and applies $2V_{DD}/3$ to the other wirings. Further, the column decoder 231 applies $V_{DD}$ to a wiring connected to a source or a drain of the ferroelectric transistor of the selected synapse 110, and applies $V_{DD}/3$ to the other wirings. Furthermore, the input circuit 210 applies $V_{DD}/3$ to all input lines.

Accordingly, a potential difference of $V_{DD}$ with the gate side being negative is applied to a gate insulating film of the ferroelectric transistor of the selected synapse 110. On the other hand, a potential difference of $V_{DD}/3$ ($=V_{DD}-2V_{DD}/3$) is applied to a gate insulating film of a ferroelectric transistor of a synapse in the same column as the synapse 110, a potential difference of $V_{DD}/3$ ($=0-V_{DD}/3$) is applied to a gate insulating film of a ferroelectric transistor of a synapse in the same row as the synapse 110, and a potential difference of $V_{DD}/3$ ($=2V_{DD}/3-V_{DD}/3$) is applied to gate insulating films of ferroelectric transistors of other synapses. Therefore, the multiply-accumulate operation device can perform erasing only to the selected synapse 110 by appropriately setting the potential of $V_{DD}$ such that a potential difference that inverts the polarization of the gate insulating film of the ferroelectric transistor becomes a value between $V_{DD}$ and $V_{DD}/3$.

Further, as illustrated in FIG. 7C, it is also possible to perform batch erasing with respect to all the synapses 110 in the multiply-accumulate operation device by applying a substrate voltage $V_{sub}$ to a substrate on which the multiply-accumulate operation circuit 100 is formed. Specifically, $V_{DD}$ is applied as the substrate voltage $V_{sub}$, and the row decoder 232 and the column decoder 231 apply 0 V to all wirings. Furthermore, the input circuit 210 applies $V_{DD}$ to all input lines. Accordingly, the potential difference of $V_{DD}$ with the gate side being negative is applied to the gate insulating films of the ferroelectric transistors of all the synapses 110, and thus, the multiply-accumulate operation device can perform batch erasing with respect to all the synapses 110.

In the multiply-accumulate operation device according to the present embodiment, it is unnecessary to finely adjust the resistance value for each of the synapses 110, and thus, it is unnecessary to perform the writing and erasing for each of the synapses 110. Therefore, it is possible to significantly reduce the time required to write the weight in the multiply-accumulate operation device, for example, by performing the batch erasing once, and then, performing writing only to the synapse 110 to be set to the low resistance. Further, the configuration of the multiply-accumulate operation circuit 100 can be simplified according to this configuration, and thus, the area where the multiply-accumulate operation circuit 100 is formed can be further reduced.

(Modifications)

Next, modifications of the multiply-accumulate operation device will be described with reference to FIGS. 8A to 8D. FIGS. 8A to 8D are schematic circuit diagrams illustrating examples of configurations of multiply-accumulate operation devices according to the modifications.

For example, the voltage difference of $\pm V_{DD}/3$ is applied to the gate insulating film even in the ferroelectric transistor of the unselected synapse 110 in the writing and erasing with respect to the synapse 110 illustrated in FIGS. 7A and 7B. As a result, the resistance value of the ferroelectric transistor of the unselected synapse 110 is likely to be affected.

Figure 8A:
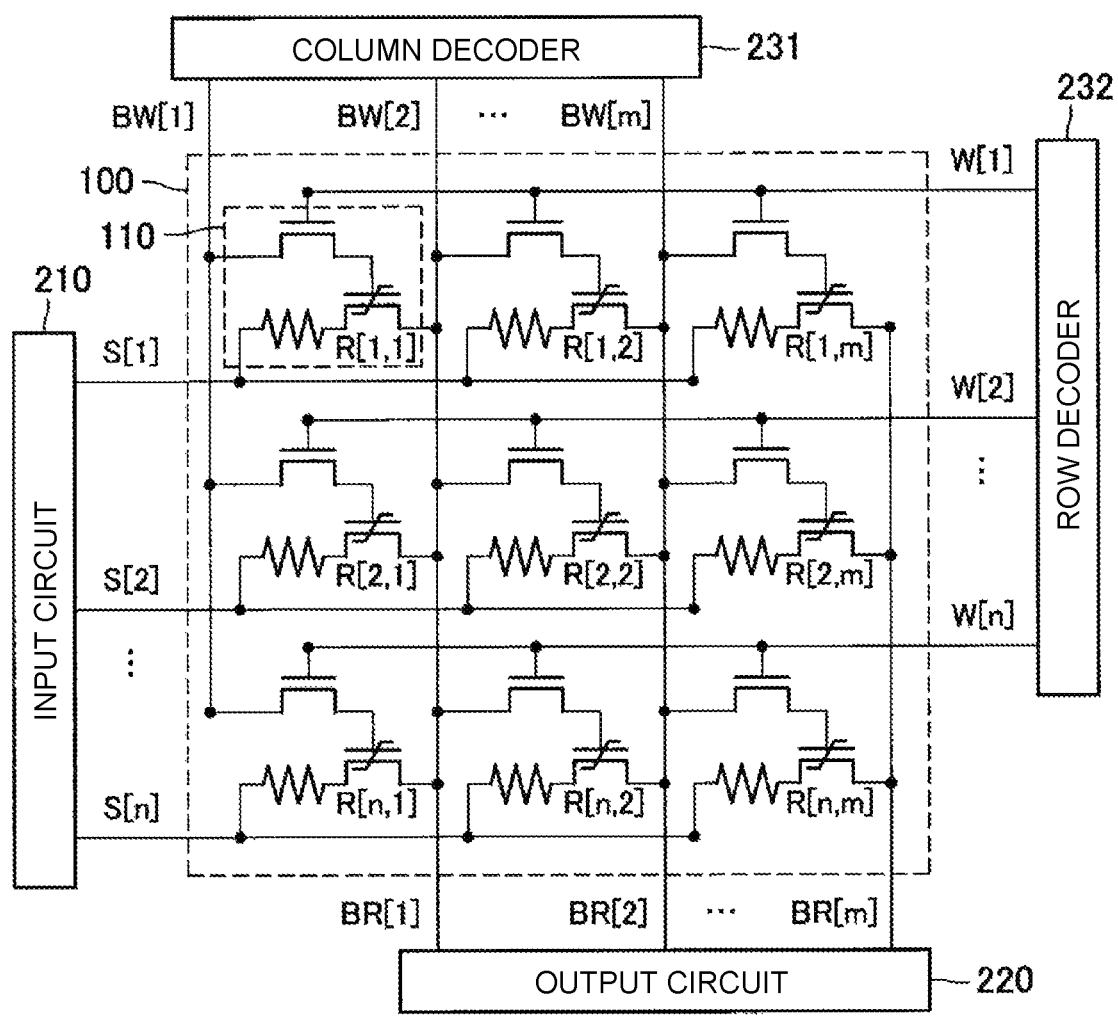
FIG. 8A is a schematic circuit diagram illustrating an example of a configuration of a multiply-accumulate operation device according to a modification.

In the case of avoiding such influence on the unselected synapse 110, a selection transistor connected to the gate of the ferroelectric transistor may be further provided in each of the synapses 110 as in the modification of the multiply-accumulate operation device illustrated in FIG. 8A. In the multiply-accumulate operation device illustrated in FIG. 8A, when writing or erasing is performed with respect to a selected synapse [i,j], the writing or erasing with respect to the selected synapse 110 can be performed by applying a predetermined voltage to each wiring of S[i], W[i], and BW[j] corresponding to the selected synapse [i,j] and grounding the other wirings.

Further, the weight of each of the synapses 110 has two values of on and off in the combination of the ferroelectric transistor and the fixed resistance element as illustrated in FIG. 3. Here, one synapse 110 may be configured using, for example, a plurality of ferroelectric transistors and fixed resistance elements in order to obtain higher resolution of the weight of each of the synapses 110.

Figure 8B:
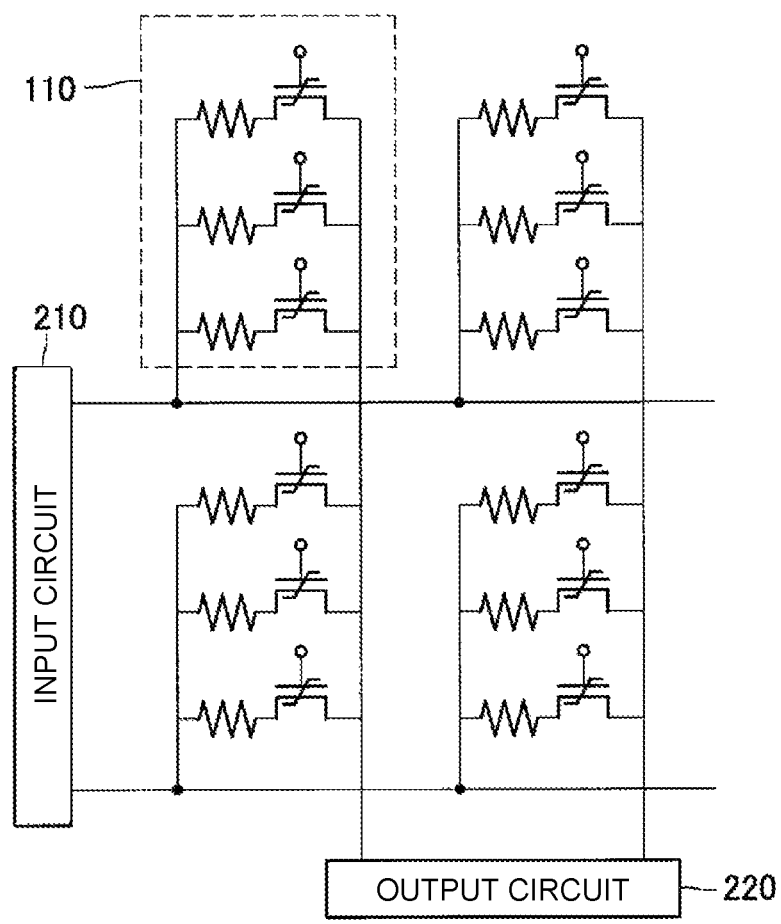
FIG. 8B is a schematic circuit diagram illustrating an example of a configuration of a multiply-accumulate operation device according to a modification.

For example, as illustrated in FIG. 8B, a plurality of circuits may be provided in parallel inside one synapse 110, each circuit having a ferroelectric transistor and a fixed resistance element connected in series. Accordingly, when resistance values of the fixed resistance elements of the plurality of circuits provided in parallel are the same, it is possible to obtain the conductivity in (the number of parallel circuits+1) levels. For example, when the number of parallel circuits is three and the conductivity of each of the fixed resistance elements is 1, it is possible to obtain the conductivity in four levels of 0, 1, 2, and 3. On the other hand, when the resistance values of the fixed resistance elements of the plurality of circuits provided in parallel are different, it is possible to set the conductivity in more levels with the same number of parallel circuits. For example, when the number of parallel circuits is three and the conductivity of each of the fixed resistance elements is 1, 3, and 5, it is possible to obtain the conductivity in eight levels of 0, 1, 3, 4, 5, 6, 8, and 9 through combination with the on/off control of the ferroelectric transistor. Accordingly, it is possible to improve the resolution of the entire circuit provided in parallel.

Figure 8C:
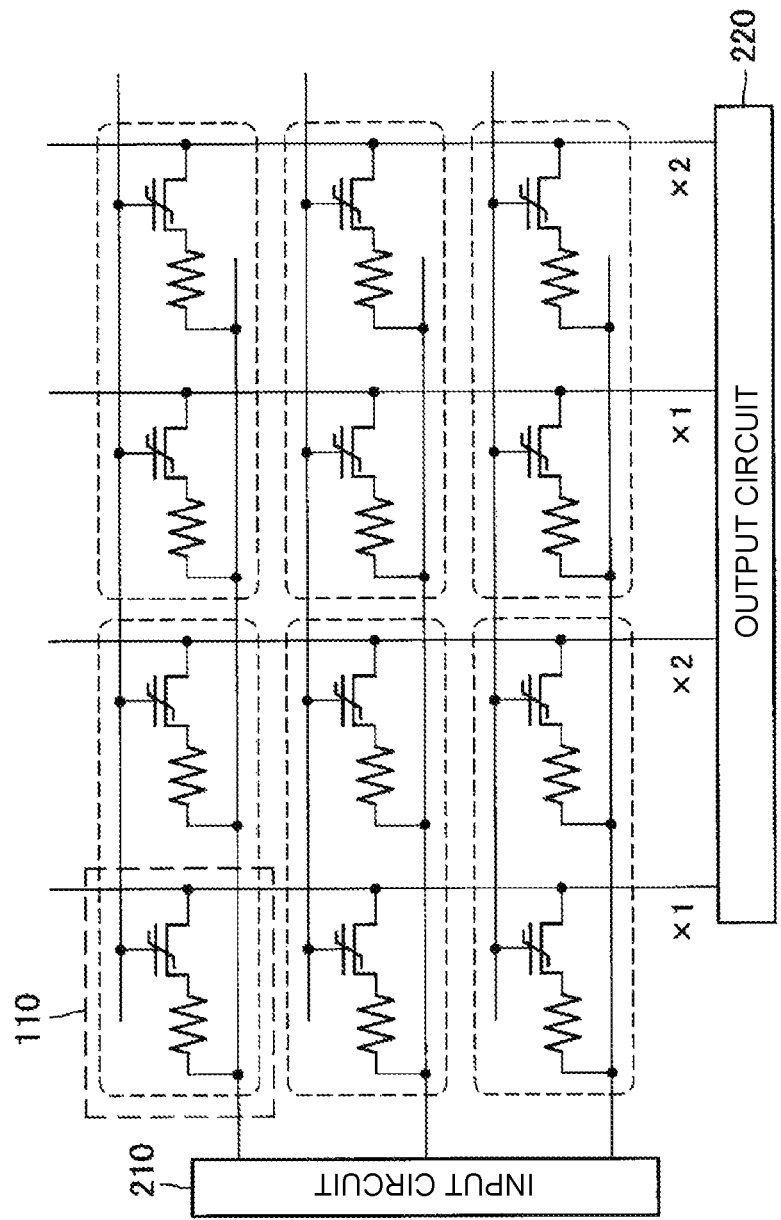
FIG. 8C is a schematic circuit diagram illustrating an example of a configuration of a multiply-accumulate operation device according to a modification.

Further, for example, as illustrated in FIG. 8C, a neural network using a synapse with high resolution can be implemented in the multiply-accumulate operation device even by increasing output lines along with an increase of the synapses 110 and adding up multiply-accumulate operation results of the respective outputs by the output circuit 220. In such a case, the multiply-accumulate operation device can realize higher resolution by multiplying each output obtained for each output line by a coefficient and then adding the resultants by the output circuit 220. For example, when using two synapses 110 and two output lines as illustrated in FIG. 8C, it is possible to realize the multiply-accumulate operation device equivalent to a case of using a synapse having the resolution of 2 bits (4 levels) by doubling a current from one output line, and then, adding a current from the other output line to the current.

Figure 8D:
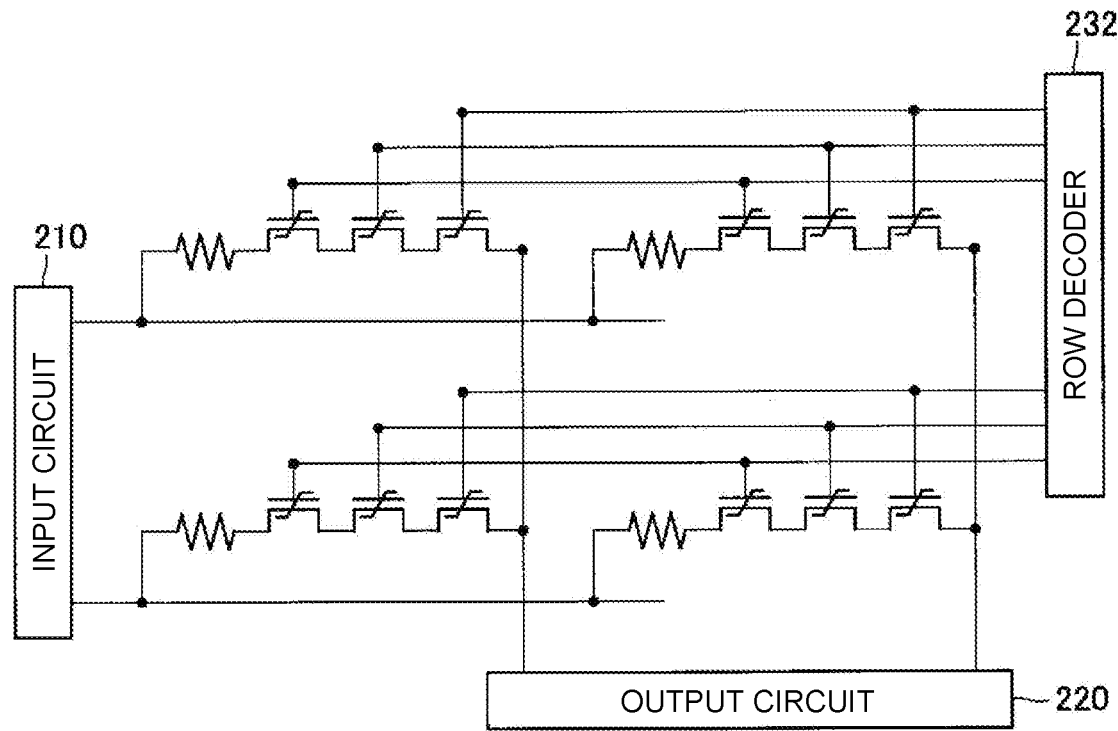
FIG. 8D is a schematic circuit diagram illustrating an example of a configuration of a multiply-accumulate operation device according to a modification.
Figure 9A:
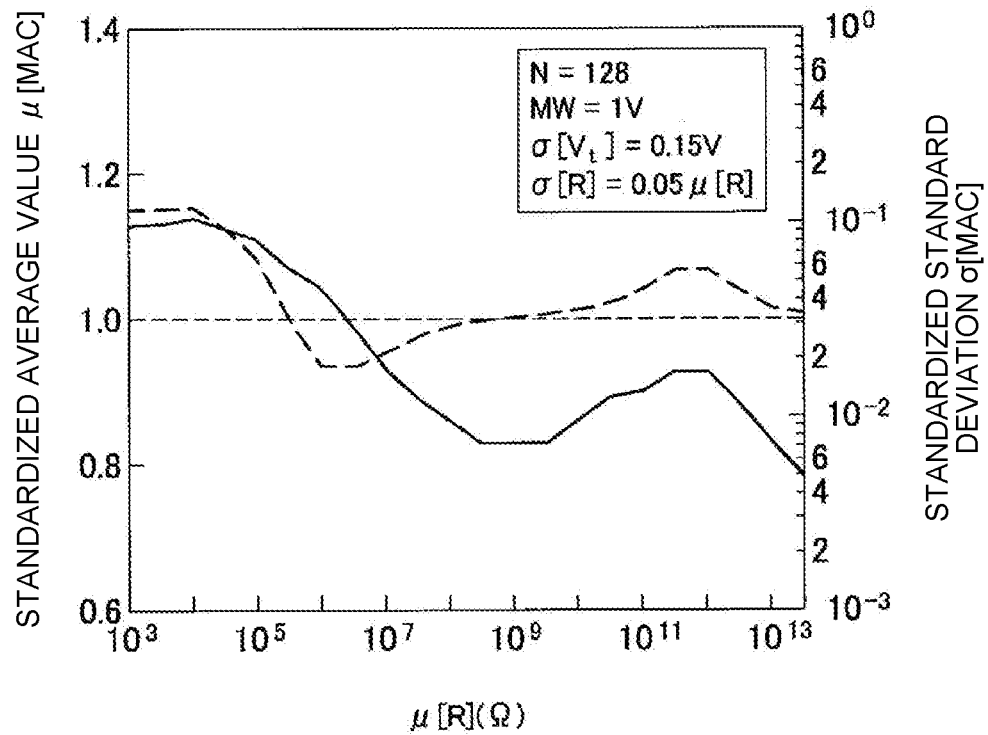
FIG. 9A is a graph illustrating a simulation result of a multiply-accumulate operation device of N rows and one column.
Figure 9B:
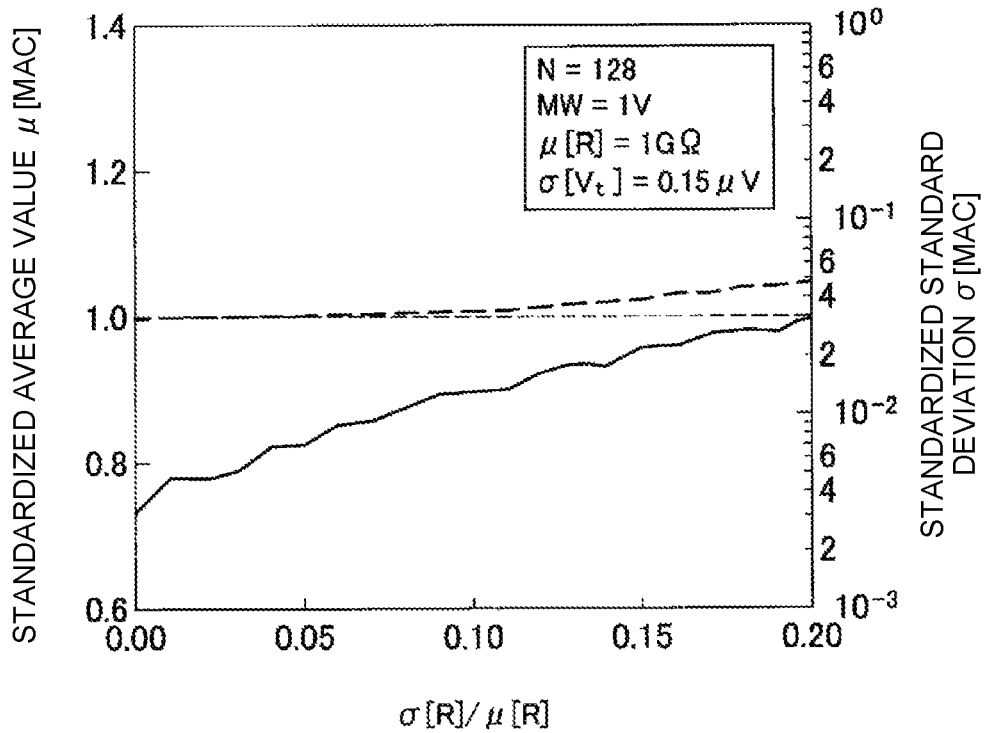
FIG. 9B is a graph illustrating a simulation result of the multiply-accumulate operation device of N rows and one column.
Figure 9C:
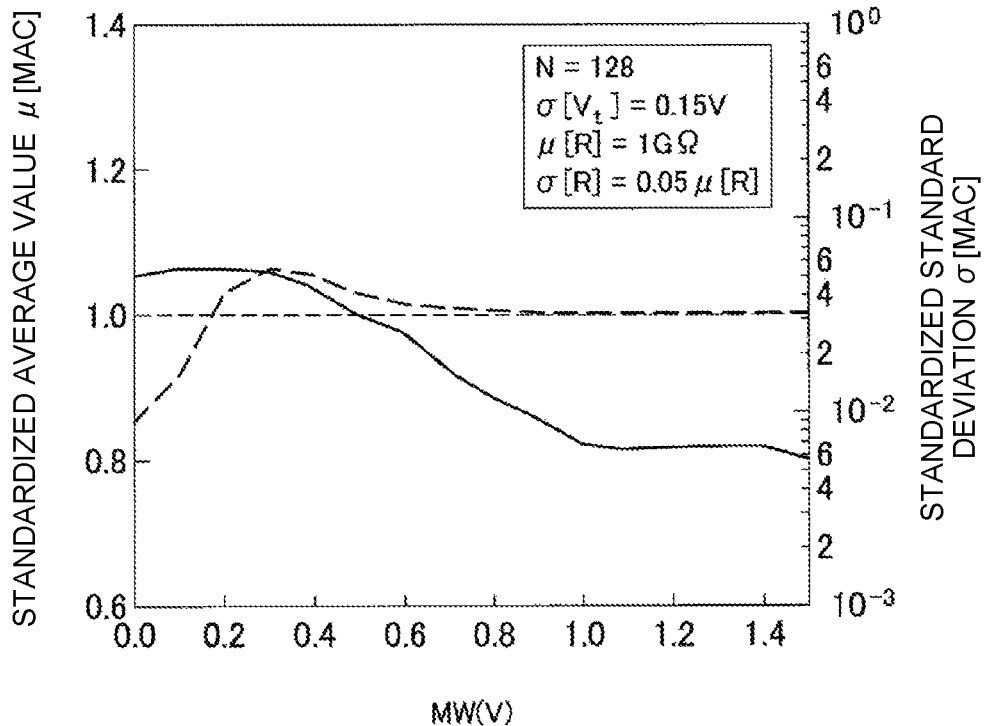
FIG. 9C is a graph illustrating a simulation result of the multiply-accumulate operation device of N rows and one column.
Figure 9D:
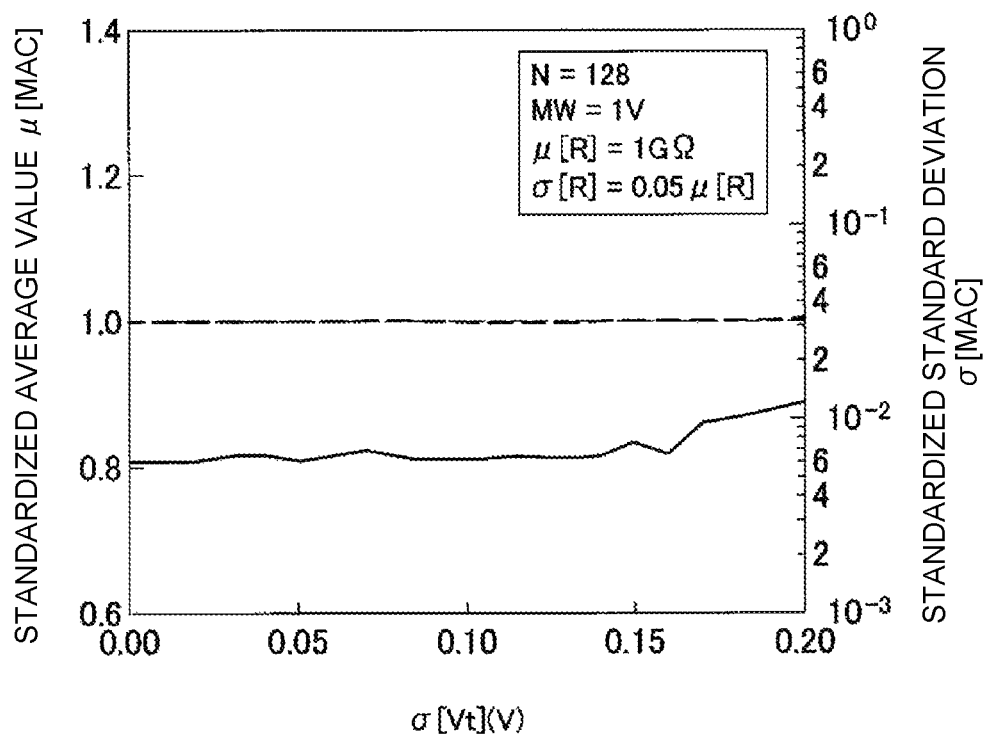
FIG. 9D is a graph illustrating a simulation result of the multiply-accumulate operation device of N rows and one column.

Furthermore, there is a case where the setting of the weight of each of the synapses 110 in the multiply-accumulate operation device differs for each target operation. In such a case, each of the synapses 110 may have the input circuit 210 and the output circuit 220 in common such that only the combination of the weights of the respective synapses 110 can be changed. For example, as illustrated in FIG. 8D, ferroelectric transistors of the synapse 110 may be connected in series while providing the input circuit 210, the output circuit 220, and the fixed resistance element in common. In the multiply-accumulate operation device illustrated in FIG. 8D, a ferroelectric transistors other than a ferroelectric transistor to be weighted can be set to a low resistance state by applying a gate voltage. Alternatively, the ferroelectric transistor can be controlled to the on-state or the off-state by setting Vt so as to form the low resistance state of the ferroelectric transistor when the gate voltage is 0 V, and applying the gate voltage only to the ferroelectric transistor to be weighted. Accordingly, the input circuit 210, the output circuit 220, and the fixed resistance element can be shared by each of the synapses 110, and thus, the multiply-accumulate operation device can be further downsized.

<3. Accuracy of Multiply-Accumulate Operation Device>

Next, the accuracy of the multiply-accumulate operation device according to the present embodiment will be described with reference to FIGS. 9A to 9D. FIGS. 9A to 9D are graphs illustrating simulation results of a multiply-accumulate operation device including a multiply-accumulate operation circuit 100 of N rows and one column that includes N synapses 110 each including a ferroelectric transistor and a fixed resistance element. Note that, in FIGS. 9A to 9D, a solid line represents a standardized standard deviation $\sigma_{MAC}$, and a broken line represents a standardized average value $\mu_{MAC}$.

First, the simulation of the multiply-accumulate operation device was executed under the following conditions. Specifically, a resistance value of the ferroelectric transistor is assumed to have the Id-Vg characteristics of FIG. 4 and a distribution determined by $\mu_{Vt}=\pm MW/2$ and $\sigma_{Vt}$. Further, a resistance value of the fixed resistance element was $\mu_R$, and was randomly determined so as to have a normal distribution of $\sigma_R$. With N=128, a weight was written so as to set half of the synapses 110 in the on-state and set the remaining half in the off-state, and an output $\Sigma(G[i]*V_S[i])$ in a case of applying a voltage $V_S[i]$ (=1 V) to an input line S was calculated. Note that the setting of weights of the synapses 110 was randomly changed to perform sampling 200 times, and results thereof were approximated by a normal distribution in the simulation of the multiply-accumulate operation device. The simulation results are illustrated in FIGS. 9A to 9D.

In FIGS. 9A to 9D, the standardized average value $\mu_{MAC}$ and the standardized standard deviation $\sigma_{MAC}$ are standardized with a mode value $\mu_{MAC'}=64$ $(\mu_{on'}+\mu_R)+64$ $(\mu_{off'}+\mu_R)$ calculated based on an on-resistance $\mu_{on'}$ and an off-resistance $\mu_{off'}$ of a FeFET having the highest appearance frequency, and an average resistance $\mu_R$ of a fixed resistance element. Note that a resistance distribution of the ferroelectric transistor follows a log-normal distribution, and thus, a mode value $\mu'$ and an average value $\mu$ are different in a strict sense.

When the Id-Vg characteristics other than the threshold voltage Vt of the ferroelectric transistor are fixed, there are five factors that affect the accuracy of the multiply-accumulate operation device, that is, $\mu_R$, $\sigma_R$, MW, $\sigma_{Vt}$ and N. Thus, typical values were put to parameters other than $\mu_R$ in order to verify the effect of adding the fixed resistance element. Specifically, $\sigma_R=0.05\mu_R$, MW=1 V, $\sigma_{Vt}=0.15$ V, and N=128.

As a result, when $\mu_R=10$ kΩ, which is sufficiently smaller than $\mu_{on'}$ (~1 MΩ) of the ferroelectric transistor as illustrated in FIGS. 9A to 9D, it can be understood that an on-conductivity of a combined resistance is almost equal to that of the ferroelectric transistor alone, and $\sigma_{MAC}=0.1$. On the other hand, when $\mu_R=1$ GΩ, which is sufficiently larger than $\mu_{on'}$, it can be understood that $\sigma_{MAC}<0.01$ and the accuracy of the multiply-accumulate operation device is improved by about 10 times. Further, when $\mu_R$ is in the range of 10 kΩ to 1 GΩ, it can be understood that $\sigma_{MAC}$ also tends to be gradually improved along with the improvement of the variation in the distribution of the on-resistance. However, when $\mu_R$ exceeds 1 GΩ, $\sigma_{MAC}$ increases by being affected by the variation in the off-resistance of the ferroelectric transistor, and thus, the accuracy of the multiply-accumulate operation device decreases.

Therefore, according to the above simulation conditions, it can be understood that 1 GΩ at which both probability distributions of on-conductivity and off-conductivity of the ferroelectric transistor are small is optimum as the resistance $\mu_R$ of the fixed resistance element in order to improve the accuracy of the multiply-accumulate operation device.

Note that the optimum resistance value $\mu_R$ of the fixed resistance element can be increased or decreased depending on characteristics of the ferroelectric transistor, in particular, magnitudes of the on-conductivity and off-conductivity and the distributions of these conductivities. However, the probability distributions of on-conductivity and off-conductivity become minimum at the resistance value of $10^{\wedge}\{[\log(\mu_{off})+\log(\mu_{on})]/2\}$, and thus, it is considered that the multiply-accumulate operation device can obtain the highest accuracy.

Note that there was no difference in result regardless of whether the average value or the mode value was used for $\mu_{off}$ and $\mu_{on}$ in the above formula.

As can be understood from FIGS. 9A to 9D, the effect of improving the accuracy of the multiply-accumulate operation device by adding the fixed resistance element can be obtained if the resistance value $\mu_R$ of the fixed resistance element is higher than the on-resistance $\mu_{on}$ of the ferroelectric transistor (for example, 1 MΩ or more). Note that the high multiply-accumulate operation accuracy of $\sigma_{MAC}<0.01$ is realized in the range of $\mu_R$ from 100 MΩ to 10 GΩ in the simulations illustrated in FIGS. 9A to 9D. However, if $\sigma_{Vt}$ of the ferroelectric transistor can be further reduced, it is also possible to realize the high multiply-accumulate operation accuracy in a wider range of $\mu_R$ (for example, 10 MΩ to 100 GΩ).

Further, when attention is paid to $\mu_{MAC}$, $\mu_{MAC}$ matches the mode value $\mu_{MAC'}$ at 1 GΩ, but the average value and the mode value are slightly different when $\mu_R$ approaches $\mu_{on'}$ or $\mu_{off'}$. Thus, if the resistance value is set based on the mode values $\mu_{on'}$ and $\mu_{off'}$, there is a problem that it is difficult to obtain a desired resistance value because a result of a multiply-accumulate operation is offset by several percent. In consideration of such a viewpoint, the resistance value $\mu_R$ of the fixed resistance element is preferably in the range of 100 MΩ to 10 GΩ in which there is no large difference between the average value and the mode value.

However, the distribution of the combined resistance of the ferroelectric transistor and the fixed resistance element is affected by $\sigma_R$, and the distribution of the combined resistance matches $\sigma_R$ when $\mu_R$ is sufficiently larger than $\mu_{on}$. Therefore, it is also important to reduce $\sigma_R$ in order to improve the accuracy of the multiply-accumulate operation device. Further, when $\sigma_R$ is larger than $\sigma_{on}$, it is difficult to obtain the effect of improving the accuracy of the multiply-accumulate operation device, and thus, it is important to make $\sigma_R/\mu_R$ smaller than $\sigma_{on}/\mu_{on}$ in order to improve the accuracy of the multiply-accumulate operation device.

<4. Accuracy of Image Classification>

Figure 10:
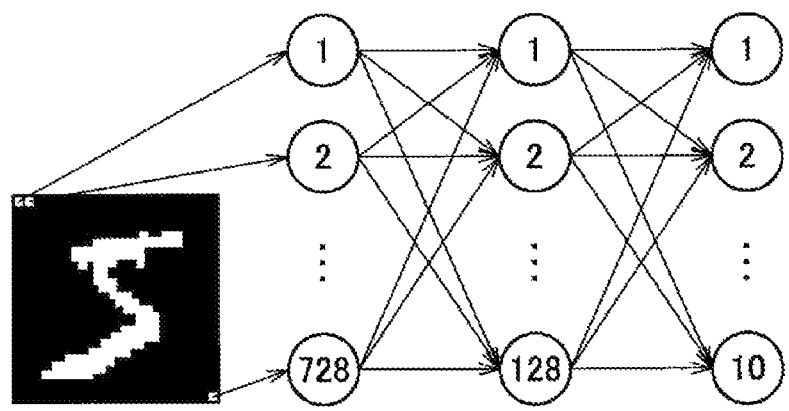
FIG. 10 is an explanatory diagram illustrating an example of a neural network by a multiply-accumulate operation device.

Next, the accuracy of image classification using a neural network by the multiply-accumulate operation device will be described with reference to FIGS. 10 and 11. FIG. 10 is an explanatory diagram illustrating an example of the neural network by the multiply-accumulate operation device.

Specifically, image classification was performed using a two-layer perceptron illustrated in FIG. 10 that includes 784 input layers, 128 hidden layers, and 10 output layers Such a two-layer perceptron can be implemented by a multiply-accumulate operation device of 784 rows and 256 columns and a multiply-accumulate operation device of 128 rows and 20 columns. Note that the number of columns is twice the number of neurons in order to separately perform a multiply-accumulate operation of negative weights and a multiply-accumulate operation of positive weights.

The two-layer perceptron described above was subjected to learning with the MNIST handwritten numeral data set, which is a modified handwritten numeral database of the National Institute for Standards and Technology (NIST), and a weight of each of the synapses 110 was determined. Note that the MNIST handwritten numeral data set has been established as a data set for evaluating the performance of a neural network, and is a data set which is suitable for comparing the performance of different neural networks.

First, each piece of 28 pixel×28 pixel image data of the data set was converted into two values of black and white, and a value of each pixel was input as a voltage (0 V or 1 V) to the input layer. Subsequently, the synapse 110 performs a multiply-accumulate operation in each layer assuming that a weight of either $R_{on}$ or $R_{off}$ is set, a difference between a positive weight and a negative weight was calculated, and then, an output was calculated by an activation function. Furthermore, regarding an output from the hidden layer, the output was calculated in the same manner by inputting the output from the input layer to the multiply-accumulate operation device of 128 rows and 20 columns with 8-bit resolution. Thereafter, an output from the output layer was compared with label data and the weight of each of the synapses 110 was optimized so as to minimize an error, thereby obtaining the weight of the synapse 110 with which the classification accuracy becomes the highest when there is no resistance distribution. On the other hand, regarding the classification accuracy when there is a resistance distribution, a distribution was given such that a standardization standard deviation becomes ac to write a synapse weight, and a handwritten character was classified based on the written value.

The MNIST handwritten numeral data set was classified using the two-layer perceptron in which the weight of each of the synapses 110 was determined by the above method to calculate the classification accuracy. Results thereof are shown in Table 1 below.

TABLE 1

| Configuration of synapse | On-resistance | Off-resistance | Standard deviation ($\sigma_G$) | Classification accuracy |
|---|---|---|---|---|
| FeFET Alone | 1 MΩ | 1 TΩ | 50% | 11% |
| FeFET + fixed resistance element | 1 GΩ | 1 TΩ | 20% | 84% |
|  |  |  | 18% | 88% |
|  |  |  | 16% | 91% |
|  |  |  | 15% | 92% |
|  |  |  | 10% | 94% |
|  |  |  | 5% | 95% |
|  |  |  | 0% | 95% |

As shown in Table 1, the two-layer perceptron using the synapse, which is constituted by the ferroelectric transistor and the fixed resistance element and has no resistance distribution (has conductivity standard deviation of 0%) and $R_{on}$=1 GΩ and $R_{off}$=1 TΩ, exhibited the high classification accuracy of 95%. Further, when the conductivity standard deviation is 5% and 10%, the two-layer perceptron using the synapse constituted by the ferroelectric transistor and the fixed resistance element exhibited the same high classification accuracy. On the other hand, it has been found that the classification accuracy is low as 11% so that meaningful classification becomes difficult in a two-layer perceptron using a synapse, which is constituted by FeFET alone and has a standard deviation $\sigma_G$ of conductivity of 50% and $R_{on}$=1 MΩ and $R_{off}$=1 TΩ.

Therefore, it can be understood that the high classification accuracy can be realized without adjusting the resistance values of the respective synapses 110 by connecting the fixed resistance element having the small resistance distribution in series with the ferroelectric transistor in the multiply-accumulate operation device according to the present embodiment. Meanwhile, it can be understood that the accuracy of image classification remarkably decreases in the multiply-accumulate operation device using the ferroelectric transistor alone as a synapse in which adjustment of the resistance value is not performed.

Referring to the results in Table 1, it is desirable to suppress the standard deviation of the resistances of the respective synapses 110 to 10% or less in order to realize the high classification accuracy in the multiply-accumulate operation device. However, the standard deviation of the resistances of the respective synapses 110 can be allowed up to about 20% in applications where the requirement for classification accuracy is relatively gentle (for example, 80% or more).

Further, in order to obtain the high classification accuracy in the multiply-accumulate operation device, it is also important that a ratio of the on-resistance and the off-resistance of the synapse 110 (on/off resistance ratio $R_{off}/R_{on}$) is high, in addition to the small standard deviation $\sigma_G$ of the conductivity of the synapse 110. For example, FIG. 11 illustrates a graph of simulation results of classification accuracy at different on/off resistance ratios.

Figure 11:
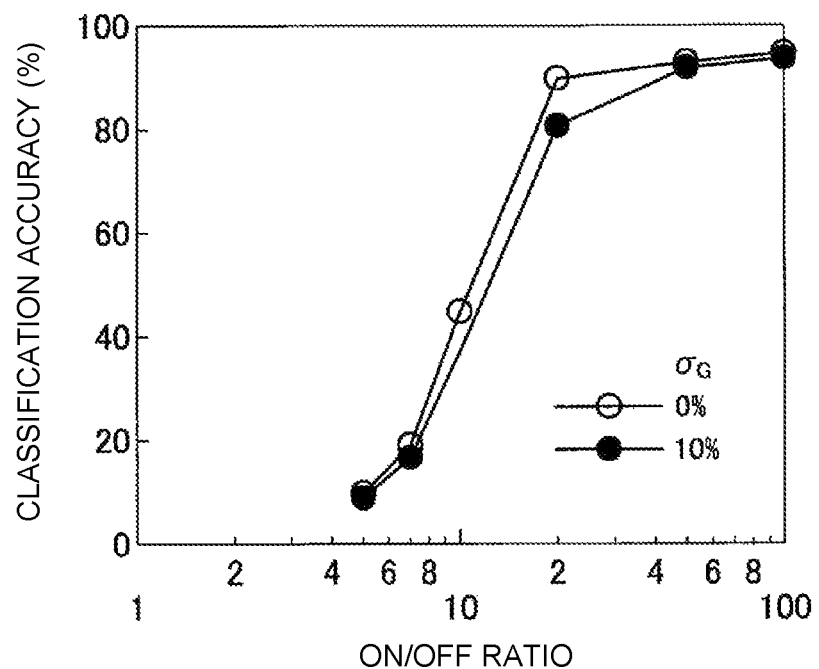
FIG. 11 is a graph illustrating simulation results of classification accuracy at different on/off resistance ratios.

As illustrated in FIG. 11, it can be understood that the on/off resistance ratio of 20 or more is required in order to obtain the high classification accuracy of 90% or more required for applications requiring strict classification. Further, it can be understood that the effect of improving the classification accuracy can be obtained if the on/off resistance ratio is 5 or more. That is, regarding the resistance value $\mu_R$ of the fixed resistance element, it can be understood that $\mu_R < \mu_{off}/5$ is preferable in order to obtain the effect of improving the classification accuracy, and $\mu_R < \mu_{off}/20$ is preferable in order to obtain the high classification accuracy of 90% or more.

Note that the series-connection between the fixed resistance element having the resistance value higher than the on-resistance of the ferroelectric transistor and the ferroelectric transistor limits the current flowing through the synapse 110, which may be as a factor that slows down an operation speed of the multiply-accumulate operation device. However, the multiply-accumulate operation device performs all multiply-accumulate operations at the same time, and thus, it is possible to secure a sufficient operation speed in use. For example, the multiply-accumulate operation device is sufficiently capable of performing image recognition at about 60 Hz of a video frame.

Meanwhile, the energy efficiency of the multiply-accumulate operation device is improved as the resistance value of the synapse 110 increases, and thus, it is effective to provide the fixed resistance element in terms of improving the overall performance of the multiply-accumulate operation device. Furthermore, as the on-resistance of the synapse 110 increases, the amount of current flowing from the multiple synapses 110 to the output line decreases, and the output line is less likely to be damaged. Thus, it is also expected to improve the reliability of the multiply-accumulate operation device.

<5. Specific Structure of Multiply-Accumulate Operation Device>

Next, a specific structure, a material and the like for implementation of the above multiply-accumulate operation device will be described with reference to FIGS. 12A to 20.

(Structure and Material of Fixed Resistance Element)

First, a structure and a material of the fixed resistance element provided in the multiply-accumulate operation device will be described with reference to FIGS. 12A to 14B.

In the multiply-accumulate operation device according to the present embodiment, it is possible to select arbitrary structure and material of the fixed resistance element if the required $\mu_R$ and $\sigma_R$ can be realized. However, it is desirable that the fixed resistance element be an element that has high affinity with an integrated circuit and a high integration degree and has low temperature dependence and voltage dependence.

Figure 12A:
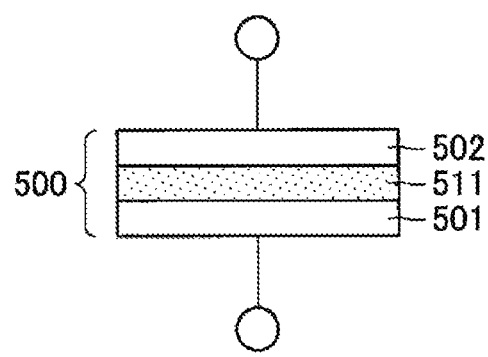
FIG. 12A is a schematic diagram illustrating an example of a structure of a laminated tunnel resistance element.

For example, as illustrated in FIG. 12A, the fixed resistance element may be a laminated tunnel resistance element 500 having a structure (MIM structure) in which an insulator 511 (Insulator: I) is sandwiched by a pair of conductors 501 and 502 (Metal: M). FIG. 12A is a schematic view illustrating an example of the structure of the laminated tunnel resistance element 500.

Although the laminated tunnel resistance element 500 has an extremely high resistance value when the insulator 511 has a large film thickness, electrons of the conductors 501 and 502 tunnel through the insulator 511 so that an arbitrary resistance can be obtained when the film thickness of the insulator 511 is reduced to several nm. The tunnel resistance depends not only on the film thickness of the insulator 511 but also on a barrier height and a material of the insulator 511. Therefore, the film thickness of the insulator 511 of the laminated tunnel resistance element 500 is determined by the combination of the materials of the conductors 501 and 502 and the material of the insulator 511. Since the tunnel resistance element has a small temperature dependency in principle and can be used in a wide temperature range without using a temperature compensation circuit, and thus, the multiply-accumulate operation device can improve the operation accuracy and classification accuracy. Accordingly, the multiply-accumulate operation device can be further downsized.

Structural examples of the laminated tunnel resistance element 500 capable of realizing a resistance value of 1 GΩ in a plane area of 0.01 μm$^2$ include CoFeB/MgO/CoFeB (d=4.4 nm), TiN/ZrO$_2$/TiN (d=2.5 nm), ITO/ZrO$_2$/ITO (d=2.5 nm), TiN/HfO$_2$/ITO (d=2.5 nm), TiN/SiO$_2$/TiN (d=1.5 nm), TiN/Al$_2$O$_3$/TiN (d=1.2 nm), and the like when the film thickness of the insulator 511 is d. Note that the film thicknesses of the conductors 501 and 502 and the insulator 511 are sensitive to a chemical bonding state, unevenness, and the like of a bonding interface between each of the conductors 501 and 502 and the insulator 511, and thus, a desired resistance may not always be obtained with the above film thicknesses.

However, the structure and material of the laminated tunnel resistance element 500 are not limited thereto. As the structure and material of the laminated tunnel resistance element 500, arbitrary structure and material can be selected without particular limitation if a tunnel barrier is formed and a desired resistance value is obtained.

For example, the conductors 501 and 502 may be made of Ti, Ta, W, Cu, Ru, Pt, Ir, In, Sn, Zn, Ga or C, or a compound, oxide or nitride thereof. The two conductors 501 and 502 may be made of the same material or different materials.

For example, the insulator 511 may be made of SiO$_2$, Si$_3$N$_4$, HfO$_2$, ZrO$_2$, TiO$_2$, Al$_2$O$_3$, AlN, MgO, or BN, or a mixture thereof. Further, the insulator 511 may be a single insulator 511 configured by laminating different insulator materials (Insulator) and Insulator2: I$_1$, and I$_2$). (For example, MI$_1$I$_2$M structure).

Further, it is also possible to use a semiconductor material (Semiconductor: S) instead of the conductors 501 and 502 or the insulator 511 (for example, MSM, SIS, MIS, SSM, or SSS structure). The semiconductor material may be Si, Ge, GaAs, InAs, InSb, Ga, In, Zn, Ga, Ti, Mo, W, C, or Nb, or a compound, oxide, nitride, sulfide, or selenide thereof. Furthermore, the semiconductor material may be doped with an impurity of an n-type semiconductor or a p-type semiconductor.

Here, the tunnel resistance element 500 having a single-layer tunnel junction as illustrated in FIG. 12A is easy to form, and thus, is excellent in mass productivity, but the resistance value may have voltage dependence. Therefore, it is preferable to use the tunnel resistance element 500 having low voltage dependence when using a plurality of voltages as an input voltage for the synapse 110.

Figure 12B:
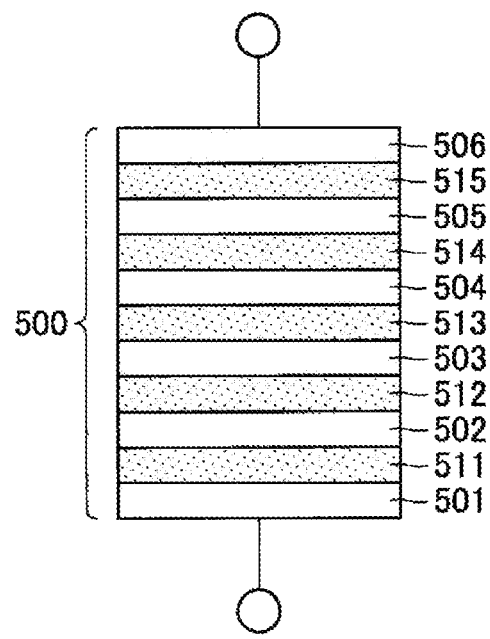
FIG. 12B is a schematic diagram illustrating an example of a structure of a multilayer laminated tunnel resistance element.

For example, as illustrated in FIG. 12B, the fixed resistance element may be the tunnel resistance element 500 having a multilayer structure in which a plurality of conductors 501, 502, 503, 504, 505, and 506 (M) and a plurality of insulators 511, 512, 513, 514, and 515 (I) are alternately laminated. FIG. 12B is a schematic view illustrating an example of the structure of the multilayer laminated tunnel resistance element 500.

Figure 13A:
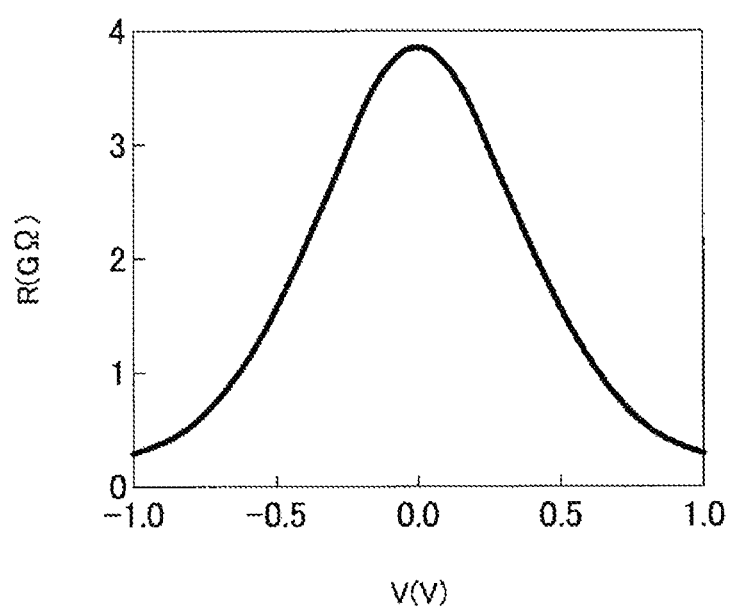
FIG. 13A is a graph illustrating an example of voltage dependence of a resistance value of a tunnel resistance element in which the number of laminated tunnel junctions is one.
Figure 13B:
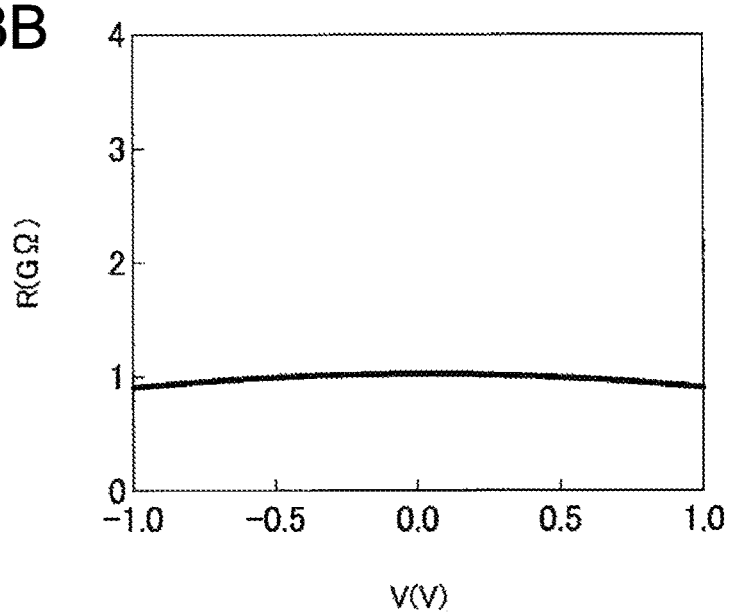
FIG. 13B is a graph illustrating an example of voltage dependence of a resistance value of a tunnel resistance element in which the number of laminated tunnel junctions is five.

Since the multilayer laminated tunnel resistance element 500 can reduce a magnitude of a voltage drop per tunnel junction, it is possible to suppress voltage dependence of a resistance value. For example, in the multilayer laminated tunnel resistance element 500 in which the tunnel junction illustrated in FIG. 12B is laminated five times, it is possible to greatly improve the voltage dependence of the resistance value. FIG. 13A illustrates an example of the voltage dependence of the resistance value of the tunnel resistance element in which the number of laminated tunnel junctions is one, and FIG. 13B illustrates an example of the voltage dependence of the resistance value of the tunnel resistance element in which the number of laminated tunnel junctions is five. Referring to the graphs of FIGS. 13A and 13B, it can be understood that an increase in the number of laminated tunnel junctions significantly improves the voltage dependence of the resistance value of the tunnel resistance element 500.

Further, in the multilayer laminated tunnel resistance element 500, it is possible to reduce a parasitic capacitance to about 1/y and to reduce $\sigma_R$ to $1/\sqrt{y}$ by increasing the number y of laminated tunnel junctions. Accordingly, it is possible to further improve the energy efficiency and operation accuracy of the multiply-accumulate operation device.

Note that each layer of the conductor or the insulator of the above-described laminated tunnel resistance element 500 can be manufactured by sequentially depositing a material of each layer using, for example, a sputtering method, a vapor deposition method, an atomic layer deposition method, a chemical vapor deposition method, or a coating method.

Further, the tunnel junction is not necessarily formed like the layer in the tunnel resistance element 500. For example, the tunnel junction may be formed by a three-dimensional network structure in the tunnel resistance element 500. An example of the tunnel resistance element 500 in which the tunnel junction is formed by the three-dimensional network structure is illustrated in FIGS. 14A and 14B.

Figure 14A:
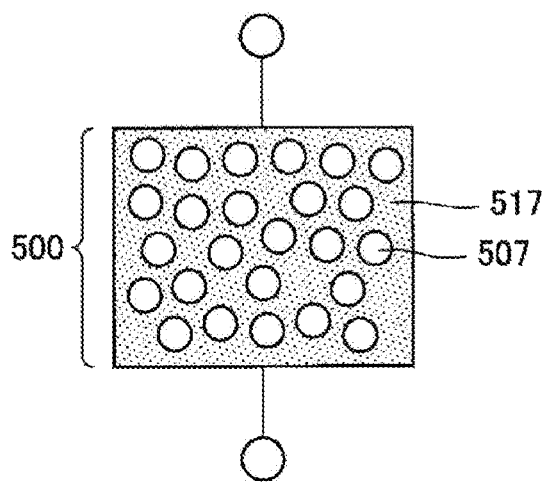
FIG. 14A is a schematic view illustrating an example of a tunnel resistance element in which a tunnel junction is formed by a three-dimensional network structure.

As illustrated in FIG. 14A, the tunnel resistance element 500 may be a composite material in which conductive particles 507 are dispersed inside an insulator 517. In such a case, the tunnel junction is formed by the plurality of conductive particles 507 and the insulator 517 existing between the plurality of conductive particles 507.

Figure 14B:
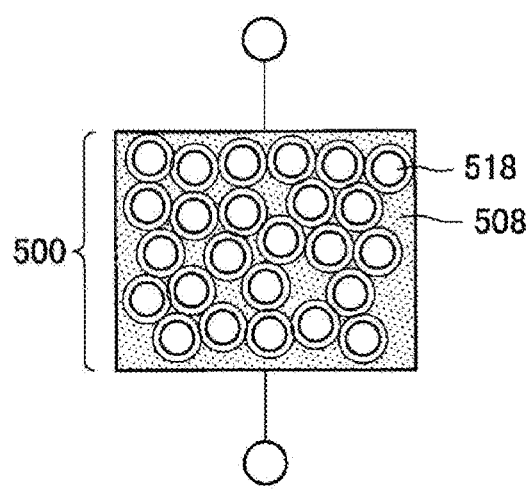
FIG. 14B is a schematic view illustrating an example of a tunnel resistance element in which a tunnel junction is formed by a three-dimensional network structure.

Alternatively, as illustrated in FIG. 14B, the tunnel resistance element 500 may be a composite material in which a composite body 508, obtained by sintering conductive particles coated with an insulating organic material or an oxide, is dispersed in an insulator 518. The tunnel resistance element 500 made of such a composite material is excellent in controllability of the resistance value, and a plurality of the tunnel junctions can be formed to be continuous using the composite body 508 and the insulator 518, so that the voltage dependence and $\sigma_R$ can be further reduced. Other examples of such a composite material include a sintered body (cermet) obtained by sintering a mixture of metal powder and ceramic powder and the like.

(Structure and Material of Variable Resistance Element)

Next, a structure and a material of the variable resistance element provided in the multiply-accumulate operation device will be described.

In the multiply-accumulate operation device according to the present embodiment, the variable resistance element is nonvolatile, and it is possible to select arbitrary structure and material if at least two or more resistance values can be stored. However, it is desirable that the variable resistance element be an element having a high on/off resistance ratio and low $\sigma_{on}$ in order to improve the operation accuracy of the multiply-accumulate operation device.

The variable resistance element can be roughly classified into two types: a transistor type and a two-terminal type.

Figure 15A:
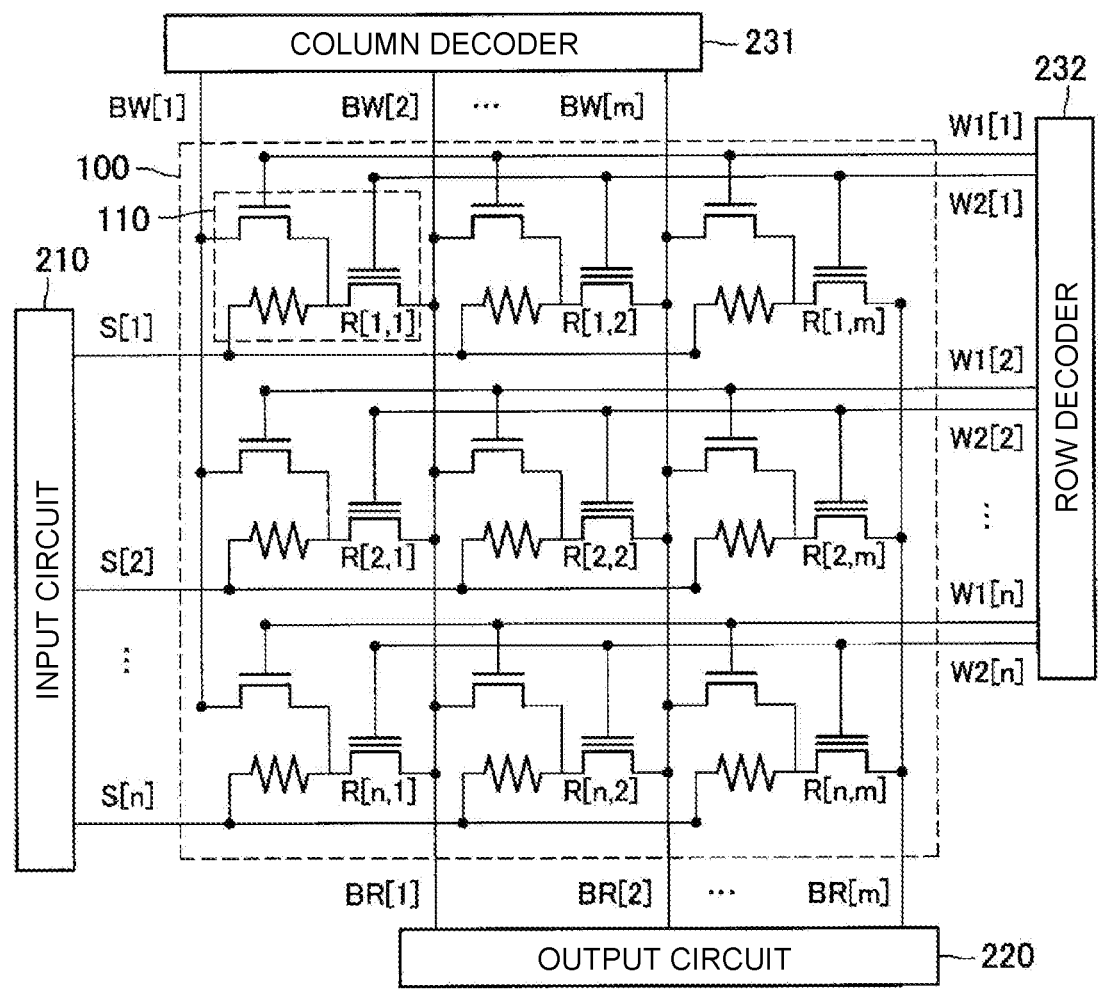
FIG. 15A is a schematic circuit diagram illustrating another example of the configuration of the multiply-accumulate operation device.

Examples of the transistor-type variable resistance element, a floating gate transistor, a MONOS transistor, a spin transistor, and the like that shifts Vt by a charge trap, in addition to the above-described ferroelectric transistor. In the floating gate transistor that shifts Vt by the charge trap, a resistance value of a variable resistance element can be changed more rapidly by applying a high source or drain voltage to inject hot electrons into a trap site in some cases. At this time, as illustrated in FIG. 15A, a selection transistor may be provided at a node between the transistor-type variable resistance element and the fixed resistance element.

In the transistor-type variable resistance element, a channel is formed in a semiconductor material. Examples of the semiconductor material in which the channel is formed may include Si, Ge, GaAs, InAs, InSb, Ga, In, Zn, Ga, Ti, Mo, W, C, or Nb, or a compound, oxide, nitride, sulfide, or selenide thereof. However, in order to obtain a high on/off resistance ratio in the transistor-type variable resistance element, silicon, a III-V compound semiconductor, a metal oxide, a transition metal chalcogenide, an organic thin film, or a polymer thin film may be used as the semiconductor material.

When the ferroelectric transistor is used as the transistor-type variable resistance element, a ferroelectric material forming a gate insulating film is not particularly limited, but, for example, lead zirconate titanate, barium titanate, bismuth ferrite, bismuth strontium tantalate, polyvinylidene fluoride, hafnium oxide, or zirconium oxide, or a mixture thereof may be used. When the ferroelectric material forming the gate insulating film is particularly hafnium oxide or zirconium oxide, or a mixture thereof, the manufacture is more easily performed since a crystallization temperature of the ferroelectric material is low.

Note that the ferroelectric material forming the gate insulating film may further include an anti-ferroelectric material. The anti-ferroelectric material changes from a non-polar state to a polar state by applying an electric field. In order to maintain the polar state of the anti-ferroelectric material, a material having a different work function may be used as a conductor in contact with the anti-ferroelectric material to generate an internal electric field.

When the ferroelectric transistor is used as the transistor-type variable resistance element, a device configuration of the ferroelectric transistor is not particularly limited. For example, the ferroelectric transistor may have a metal-ferroelectric-semiconductor (MFS) structure using a ferroelectric material (Ferroelectric: F) for a gate insulating film, may have an MFIS structure or MIFS structure in which a gate insulating film is formed using a laminated structure of a ferroelectric material (Ferroelectric: F) and an insulator material (Insulator: I), or may have an MFMIS structure in which a ferroelectric capacitor is connected to a gate electrode of a transistor that uses an insulating material for a gate insulating film.

Figure 15B:
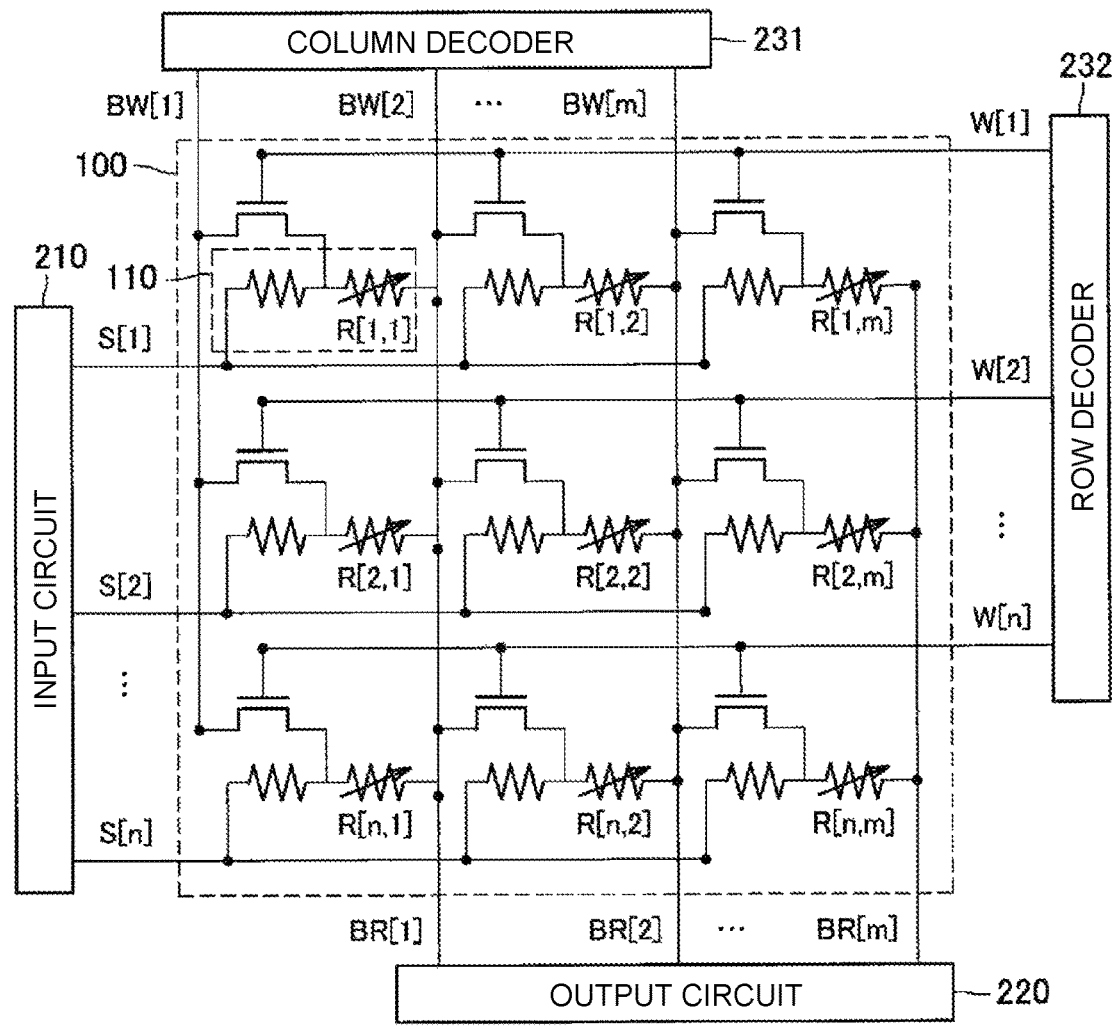
FIG. 15B is a schematic circuit diagram illustrating another example of the configuration of the multiply-accumulate operation device.

Examples of the two-terminal-type variable resistance element may include a phase-change memory (PCM), a filament-type resistance change memory (Resistance Random Access Memory: ReRAM), an interface-type resistance change memory, a magnetic tunnel junction element (MTJ), a ferroelectric tunnel junction element (FTJ), a ferroelectric diode, a carbon memory, and the like. The two-terminal-type variable resistance element writes a weight by applying a current or voltage, and thus, a selection transistor may be provided at a node between the variable resistance element and the fixed resistance element as illustrated in FIG. 15B.

(Addition of Rectifying Function to Synapse)

Figure 16A:
FIG. 16A is a circuit diagram illustrating another example of a configuration of a synapse to which a rectifying function is added.
Figure 16B:
FIG. 16B is a circuit diagram illustrating another example of a configuration of a synapse to which a rectifying function is added.
Figure 16C:
FIG. 16C is a circuit diagram illustrating another example of a configuration of a synapse to which a rectifying function is added.

Here, a structure of a fixed resistance element when a rectifying function is added to the synapse 110 will be described with reference to FIGS. 16A to 16C. FIGS. 16A to 16C are circuit diagrams illustrating other examples of the configuration of the synapse 110 to which the rectifying function is added.

For example, when the input to the multiply-accumulate operation circuit 100 is performed not by an amplitude of a voltage pulse with respect to the input line but by a pulse width, it is important to prevent backflow of a current from the output line. In such a case, it is preferable that the rectifying function be added to the synapse 110.

For example, as illustrated in FIG. 16A, the synapse 110 may be provided with a diode in series with the fixed resistance element. As the diode, a known diode, such as a Schottky diode and a pn junction diode, can be used without particular limitation. However, it is preferable that the diode have an off-resistance higher than $\mu_R$ of the fixed resistance element and an on-resistance lower than $\mu_R$ of the fixed resistance element.

Alternatively, the fixed resistance element may be configured using a high-resistance diode to add the rectifying function to the fixed resistance element as illustrated in FIG. 16B. Furthermore, the rectifying function may be added to the synapse 110 by short-circuiting the input side of the fixed resistance element and the gate of the ferroelectric transistor as illustrated in FIG. 16C.

When the fixed resistance element is a tunnel resistance element, a diode having a Schottky junction can be formed by, for example, further laminating a semiconductor on a conductor of the tunnel resistance element. In such a case, the burden of additional cost or an additional process is small, and thus, the rectifying function can be added to the synapse 110 more easily.

(Arrangement Examples of Variable Resistance Element and Fixed Resistance Element)

Figure 17:
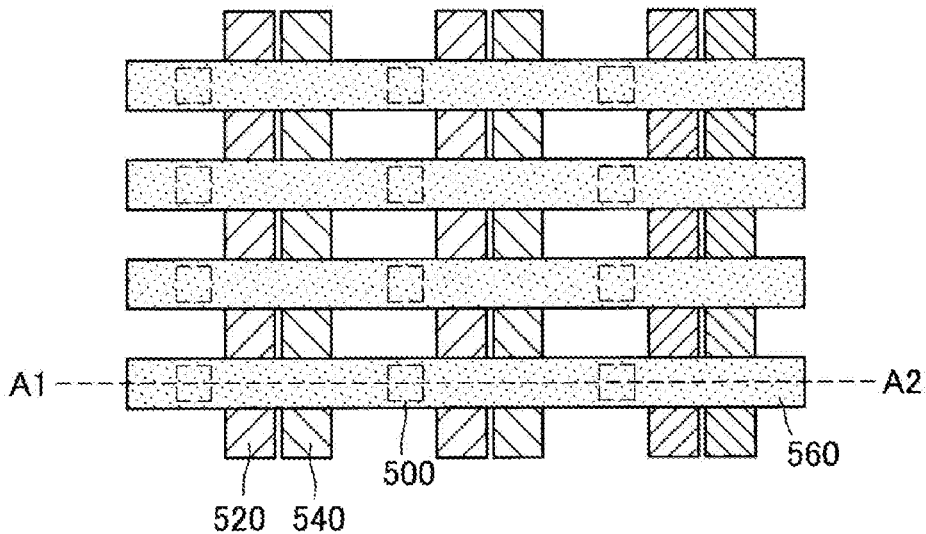
FIG. 17 is a schematic view illustrating an example of a planar arrangement of the multiply-accumulate operation device.
Figure 18:
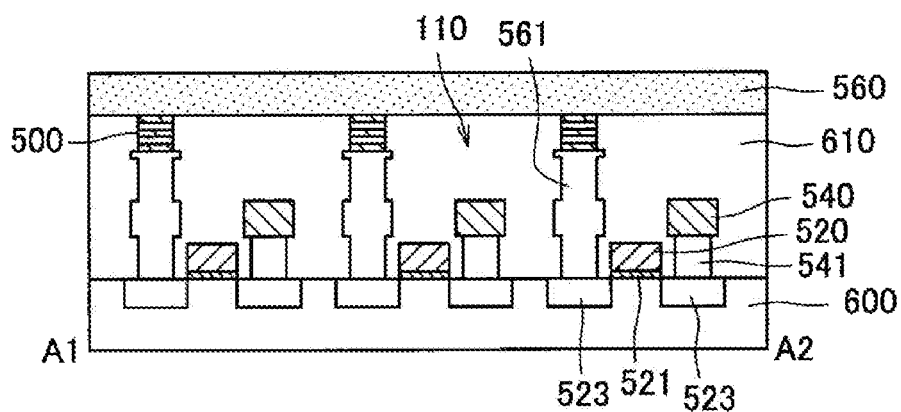
FIG. 18 is a schematic view illustrating an example of a cross section taken along line A1-A2 of FIG. 17.
Figure 19:
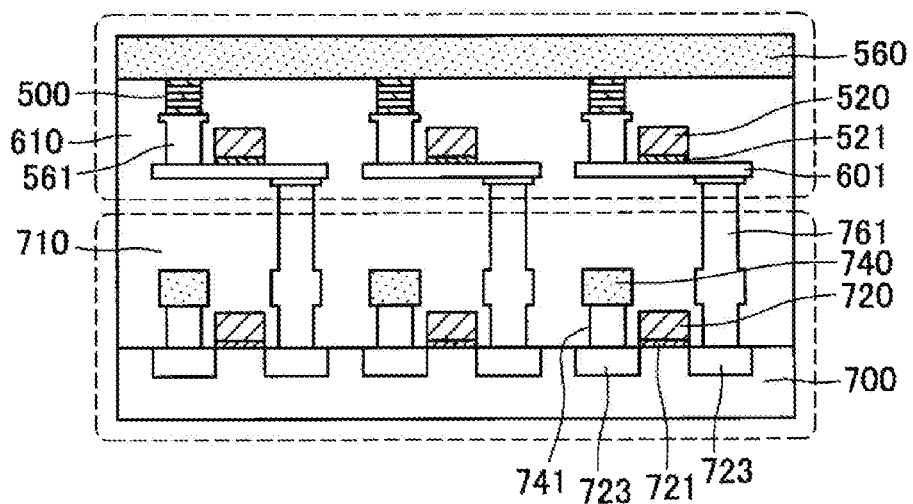
FIG. 19 is a schematic view illustrating another example of a cross-sectional arrangement of the multiply-accumulate operation device.

Next, arrangement examples of the variable resistance elements and the fixed resistance elements in the multiply-accumulate operation circuit 100 will be described with reference to FIGS. 17 to 22. FIG. 17 is a schematic view illustrating an example of a planar arrangement of the multiply-accumulate operation circuit 100, and FIG. 18 is a schematic view illustrating an example of a cross section taken along line A1-A2 of FIG. 17. FIG. 19 is a schematic view illustrating another example of a cross-sectional arrangement of the multiply-accumulate operation circuit 100.

The multiply-accumulate operation circuit 100 can be formed as a part of an integrated circuit formed on a substrate. The substrate may be a semiconductor substrate, an insulator substrate, or a conductor substrate. However, when the substrate is the semiconductor substrate, a transistor-type variable resistance element can be formed using a part of the substrate. Further, when the substrate is the insulator substrate, a transistor-type variable resistance element can be formed on a semiconductor film by forming the semiconductor film on the insulator substrate. Furthermore, when the substrate is the conductor substrate, a transistor-type variable resistance element can be formed on a semiconductor film by laminating an insulating film and the semiconductor film on the conductor substrate.

For example, as illustrated in FIGS. 17 and 18, a gate electrode 520 is provided on a semiconductor substrate 600 with a gate insulating film 521, made of a ferroelectric material, interposed therebetween. Further, source or drain regions 523 are provided in the semiconductor substrate 600 on both sides of the gate electrode 520. With these configurations, the semiconductor substrate 600 is provided with the ferroelectric transistor. The ferroelectric transistor is filled with, for example, an interlayer insulating layer 610.

The gate electrode 520 extends in a first direction (up-down direction when directly facing FIG. 17) and is connected to the column decoder 231 or the row decoder 232. One of the source and drain regions 523 is connected to an output line 540 extending in the first direction (up-down direction when directly facing FIG. 17) via a contact 541. Further, the other of the source or drain regions 523 is connected to an input line 560 via a contact 561 in a second direction orthogonal to the first direction (left-right direction when directly facing FIG. 17). Here, the laminated tunnel resistance element 500 is provided so as to be sandwiched between the contact 561 and the input line 560. Note that a semiconductor material having a predetermined magnitude of specific resistance or the like can be used as the fixed resistance element, in addition to the laminated tunnel resistance element 500. Examples of materials that can form such a fixed resistance element include Si, TiON, a metal oxide (such as ZnO), and the like. Accordingly, the fixed resistance element can be easily manufactured with a simpler structure.

The variable resistance element is not necessarily provided on the substrate on which the integrated circuit is formed, and may be formed between wiring layers of an integrated circuit. For example, as illustrated in FIG. 19, the ferroelectric transistor may be provided on a semiconductor layer 601 provided in the interlayer insulating layer 610. Specifically, the gate electrode 520 is provided on the semiconductor layer 601 with the gate insulating film 521, made of the ferroelectric material, interposed therebetween. Further, source or drain regions (not illustrated) are provided in the semiconductor layer 601 on both sides of the gate electrode 520. With these configurations, the ferroelectric transistor is provided in the semiconductor layer 601.

Further, one of the source and drain regions of the semiconductor layer 601 may be connected to a field-effect transistor provided in an interlayer insulating layer 710 and a semiconductor substrate 700 via a contact 761. The field-effect transistor provided in the interlayer insulating layer 710 and the semiconductor substrate 700 may include, for example, a gate electrode 720, a gate insulating film 721, a source or drain region 723, the contacts 761 and 741, and a wiring 740. The other of the source and drain regions of the semiconductor layer 601 is connected to the input line 560 and the like via the contact 561. Here, the laminated tunnel resistance element 500 is provided so as to be sandwiched between the contact 561 and the input line 560.

According to the configuration illustrated in FIG. 19, the multiply-accumulate operation circuit 100 can be formed to be laminated with a peripheral circuit or a semiconductor device, and thus, the planar area of the entire integrated circuit including the multiply-accumulate operation circuit 100 can be reduced. In addition, as the plurality of variable resistance elements and fixed resistance elements are formed in different layers to form the three-dimensional circuit, it is possible to further reduce the planar area of the entire integrated circuit including the multiply-accumulate operation circuit 100. Note that the transistor-type variable resistance element is formed in a planar type in FIGS. 17 to 19, but the transistor-type variable resistance element may be formed in any form of a planar type, a vertical type, a fin type, a nanowire type, or a thin film type.

Figure 20:
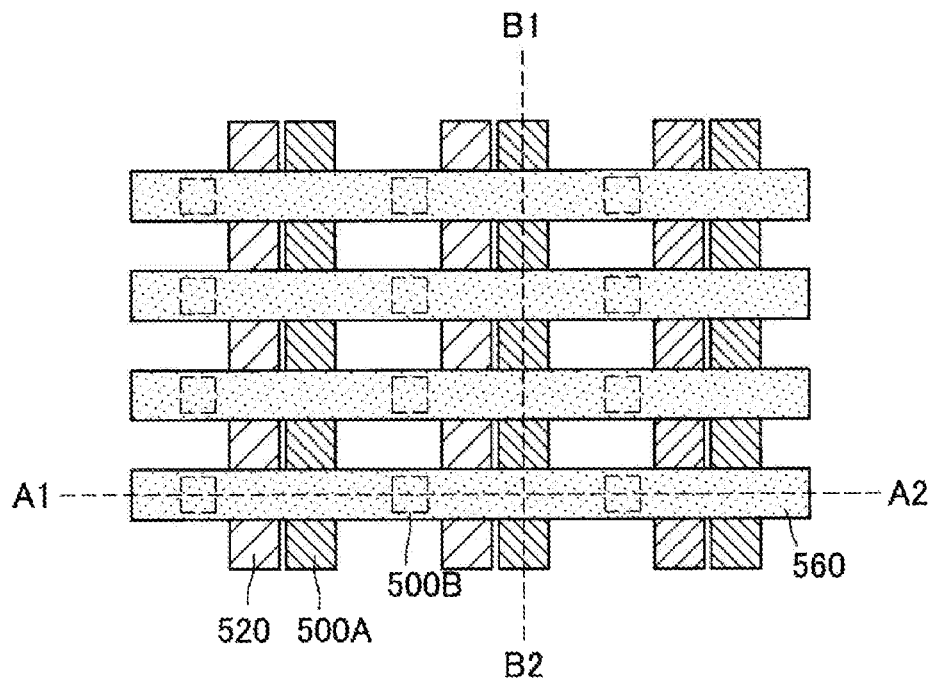
FIG. 20 is a schematic view illustrating another example of the planar arrangement of the multiply-accumulate operation device.
Figure 21:
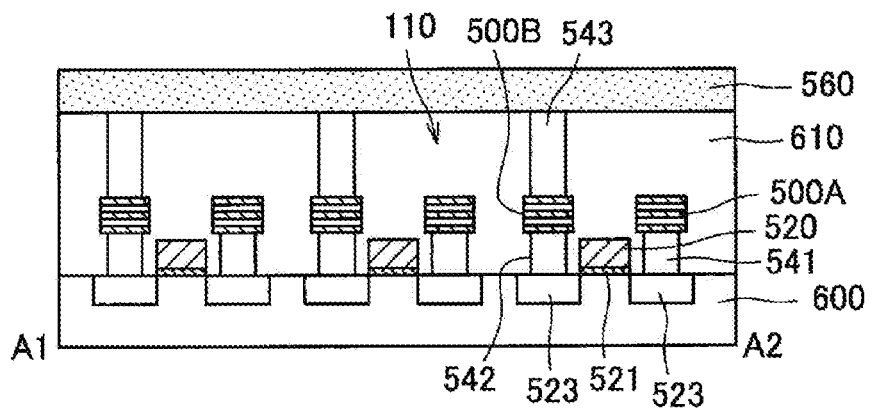
FIG. 21 is a schematic view illustrating an example of a cross section taken along line A1-A2 of FIG. 20.
Figure 22:
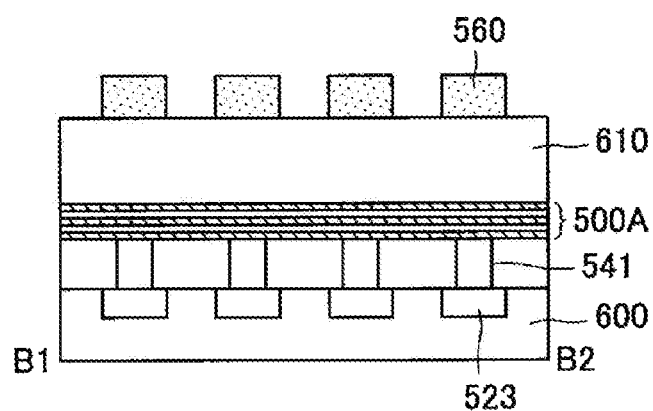
FIG. 22 is a schematic view illustrating an example of a cross section taken along line B1-B2 of FIG. 20.

Note that it suffices that the fixed resistance element is electrically connected to the variable resistance element, and a location where the fixed resistance element is formed is not particularly limited. For example, the fixed resistance element may be provided on a substrate, above or below a wiring, or in a contact hole. For example, as illustrated in FIGS. 20 to 22, the fixed resistance element may be formed integrally with a wiring by forming a part of the wiring into a laminated structure similar to that of the fixed resistance element. FIG. 20 is a schematic view illustrating another example of the planar arrangement of the multiply-accumulate operation device, FIG. 21 is a schematic view illustrating an example of a cross section taken along line A1-A2 of FIG. 20, and FIG. 22 is a schematic view illustrating an example of a cross section taken along line B1-B2 of FIG. 20.

Specifically, as illustrated in FIGS. 20 to 22, the gate electrode 520 is provided on the semiconductor substrate 600 with the gate insulating film 521, made of the ferroelectric material, interposed therebetween. Further, source or drain regions 523 are provided in the semiconductor substrate 600 on both sides of the gate electrode 520. With these configurations, the semiconductor substrate 600 is provided with the ferroelectric transistor. The ferroelectric transistor may be filled with, for example, the interlayer insulating layer 610.

The gate electrode 520 extends in the first direction (up-down direction when directly facing FIG. 20) and is connected to the column decoder 231 or the row decoder 232. One of the source and drain regions 523 is connected to a laminated wiring 500A extending in the first direction (up-down direction when directly facing FIG. 20) via the contact 541. Further, the other of the source or drain regions 523 is connected to the input line 560 via contacts 542 and 543 in the second direction orthogonal to the first direction (left-right direction when directly facing FIG. 20). Here, a laminated tunnel resistance element 500B is provided so as to be sandwiched between the contacts 542 and 543. The laminated tunnel resistance element 500B is formed at the same time as the laminated wiring 500A and has a similar laminated structure.

According to this structure, the manufacturing cost of the multiply-accumulate operation device can be reduced.

Note that, when the laminated tunnel resistance element is used as a wiring, it is possible to perform drawing out from the wiring by forming the lowermost layer of the laminated tunnel resistance element as a conductor and forming a via (through electrode) below the conductor. The via may be connected to the conductor on the lowermost layer of the laminated tunnel resistance element, or may be provided from an upper layer of the laminated tunnel resistance element through the tunnel resistance element to be connected to the conductor. Note that it goes without saying that the via may be provided on the uppermost layer side of the laminated tunnel resistance element.

While the preferred embodiments of the present disclosure have been described in detail above with reference to the accompanying drawings, the technical scope of the present disclosure is not limited to such examples. It is obvious that a person with an ordinary skill in a technological field of the present disclosure could conceive of various alterations or corrections within the scope of the technical ideas described in the appended claims, and it should be understood that such alterations or corrections will naturally belong to the technical scope of the present disclosure.

For example, the example in which the multiply-accumulate operation device is used for the image classification has been illustrated in the above embodiment, but the technique according to the present disclosure is not limited to the above example. For example, the multiply-accumulate operation device can be used for various classifiers based on artificial neural networks.

Examples of classification targets include an image, a sound, sensor data, statistical data, and the like. Further, regarding the learning of the artificial neural network, the multiply-accumulate operation device according to the present embodiment may be used as a learning device, or a separately learned synapse weight may be written and used in the multiply-accumulate operation device according to the present embodiment. Furthermore, the multiply-accumulate operation device according to the present embodiment may have a function of calculating a correction amount of synapse resistance for learning.

Note that the multiply-accumulate operation device according to the present embodiment can also be used for compression, decompression, processing, or generation of an image.

Further, the effects described in the present specification are merely illustrative or exemplary, and are not restrictive. That is, the technology according to the present disclosure can exhibit other effects that are obvious to those skilled in the art from the description in the present specification, in addition to or instead of the above effects.

Note that the following configurations come under the technical scope of the present disclosure.

(1)

A semiconductor device including:
  a plurality of synapses in which a nonvolatile variable resistance element taking a first resistance value and a second resistance value lower than the first resistance value and a fixed resistance element are connected in series; and
  an output line that outputs a sum of currents flowing through the plurality of synapses.

(2)

The semiconductor device according to (1), wherein a resistance value of the fixed resistance element is higher than the second resistance value.

(3)

The semiconductor device according to (1) or (2), wherein the resistance value of the fixed resistance element is lower than the first resistance value.

(4)

The semiconductor device according to (3), wherein the resistance value of the fixed resistance element is lower than ⅕ of the first resistance value.

(5)

The semiconductor device according to any one of (2) to (4), wherein
  a resistance value $\mu_R$ of the fixed resistance element is $0.1\mu < \mu_R < 10\mu$
  if the first resistance value is $\mu_{off}$, the second resistance value is $\mu_{on}$, and $\mu = 10^{\{[\log(\mu_{off}) + \log(\mu_{on})]/2\}}$.

(6)

The semiconductor device according to (5), wherein $\sigma_R/\mu_R$ is smaller than $\sigma_{on}/\mu_{on}$
  if a standard deviation of $\mu_R$ is $\sigma_R$ and a standard deviation of $\mu_{on}$ is $\sigma_{on}$.

(7)

The semiconductor device according to any one of (1) to (6), wherein the variable resistance element is a transistor.

(8)

The semiconductor device according to (7), wherein the variable resistance element is a ferroelectric transistor having a gate insulating film made of a ferroelectric material.

(9)

The semiconductor device according to (7) or (8), wherein the variable resistance element is an n-type transistor, and the fixed resistance element is provided on an input side of the variable resistance element.

(10)

The semiconductor device according to (7) or (8), wherein the variable resistance element is a p-type transistor, and the fixed resistance element is provided on an output side of the variable resistance element.

(11)

The semiconductor device according to any one of (1) to (10), wherein the fixed resistance element is a tunnel resistance element formed by sandwiching an insulator with conductors.

(12)

The semiconductor device according to (11), wherein the fixed resistance element is a laminated tunnel resistance element in which a single layer or a plurality of layers of the insulator and the conductor are laminated.

(13)

The semiconductor device according to (12), further including a laminated wiring having at least a part of a laminated structure in common with the fixed resistance element.

(14)

The semiconductor device according to any one of (7) to (12), wherein the fixed resistance element is provided in a contact that electrically connects a source or a drain of the transistor and a wiring layer.

(15)

The semiconductor device according to any one of (7) to (12), wherein the fixed resistance element is provided between wiring layers.

(16)

The semiconductor device according to any one of (1) to (6), wherein the variable resistance element is a two-terminal-type variable resistance element.

(17)

The semiconductor device according to any one of (1) to (16), further comprising a decoder that controls a resistance value of each of the variable resistance elements.

(18)

The semiconductor device according to (17), wherein each of the plurality of synapses is further provided with a selection transistor that controls selection or non-selection of the variable resistance element.

(19)

The semiconductor device according to any one of (1) to (18), wherein the plurality of synapses are arrayed in a matrix.

(20)

The semiconductor device according to any one of (1) to (19), wherein the plurality of synapses include a plurality of the variable resistance elements or the fixed resistance elements, and the plurality of variable resistance elements or fixed resistance elements are connected in parallel.

(21)

The semiconductor device according to any one of (1) to (20), wherein the plurality of synapses are further provided with a rectifying element.

(22)

A multiply-accumulate operation device including:

a plurality of synapses in which a variable resistance element taking a first resistance value and a second resistance value lower than the first resistance value and a fixed resistance element are connected in series; and an output line that outputs a sum of currents flowing through the plurality of synapses.

REFERENCE SIGNS LIST 10, 100 MULTIPLY-ACCUMULATE OPERATION CIRCUIT 11, 110 SYNAPSE
21, 210 INPUT CIRCUIT
22, 220 OUTPUT CIRCUIT
231 COLUMN DECODER
232 ROW DECODER

The invention claimed is:

1. A semiconductor device comprising:

a plurality of synapses each including a nonvolatile variable resistance element taking a first resistance value and a second resistance value lower than the first resistance value, a fixed resistance element connected in series with the nonvolatile variable resistance element, the fixed resistance element having a resistance value higher than the second resistance value, and a selection transistor at a node between the variable resistance element and the fixed resistance element that controls selection or non-selection of the variable resistance element; and an output line that outputs a sum of currents flowing through the plurality of synapses.

2. The semiconductor device according to claim 1, wherein the resistance value of the fixed resistance element is lower than the first resistance value.

3. The semiconductor device according to claim 2, wherein the resistance value of the fixed resistance element is lower than ⅕ of the first resistance value.

4. The semiconductor device according to claim 2, wherein a resistance value $\mu_R$ of the fixed resistance element is $0.1\mu < \mu_R < 10\mu$ when the first resistance value is $\mu_{off}$, the second resistance value is $\mu_{on}$, and $\mu = 10^{\{[\log(\mu_{off}) + \log(\mu_{on})]/2\}}$.

5. The semiconductor device according to claim 4, wherein $\sigma_R/\mu_R$ is smaller than $\sigma_{on}/\mu_{on}$ when a standard deviation of $\mu_R$ is $\sigma_R$ and a standard deviation of $\mu_{on}$ is $\sigma_{on}$.

6. The semiconductor device according to claim 1, wherein the variable resistance element is a transistor.

7. The semiconductor device according to claim 6, wherein the variable resistance element is a ferroelectric transistor having a gate insulating film made of a ferroelectric material.

8. The semiconductor device according to claim 6, wherein the variable resistance element is an n-type transistor, and
the fixed resistance element is provided on an input side of the variable resistance element.

9. The semiconductor device according to claim 6, wherein the variable resistance element is a p-type transistor, and
the fixed resistance element is provided on an output side of the variable resistance element.

10. The semiconductor device according to claim 1, wherein the fixed resistance element is a tunnel resistance element formed by sandwiching an insulator with conductors.

11. The semiconductor device according to claim 10, wherein the fixed resistance element is a laminated tunnel resistance element in which a single layer or a plurality of layers of the insulator and the conductors are laminated.

12. The semiconductor device according to claim 6, wherein
the fixed resistance element is provided in a contact that electrically connects a source or a drain of the transistor and a wiring layer.

13. The semiconductor device according to claim 6, wherein the fixed resistance element is provided between wiring layers.

14. The semiconductor device according to claim 1, wherein
the variable resistance element is a two-terminal-type variable resistance element.

15. The semiconductor device according to claim 1, further comprising
a decoder that controls a resistance value of the variable resistance element of each of the plurality of synapses.

16. The semiconductor device according to claim 1, wherein
the plurality of synapses are arrayed in a matrix.

17. The semiconductor device according to claim 1, wherein
the plurality of synapses include a plurality of the variable resistance elements or the fixed resistance elements, and the plurality of variable resistance elements or fixed resistance elements are connected in parallel.

18. The semiconductor device according to claim 1, wherein
the plurality of synapses are further provided with a rectifying element.

19. A multiply-accumulate operation device comprising:
a plurality of synapses each including
a nonvolatile variable resistance element taking two values of a first resistance value and a second resistance value lower than the first resistance value,
a fixed resistance element connected in series with the nonvolatile variable resistance element, the fixed resistance element having a resistance value higher than the second resistance value, and
a selection transistor at a node between the variable resistance element and the fixed resistance element that controls selection or non-selection of the variable resistance element; and
an output line that outputs a sum of currents flowing through the plurality of synapses.

\* \* \* \* \*